(12) United States Patent
Schlereth et al.

(10) Patent No.: US 10,969,063 B2
(45) Date of Patent: Apr. 6, 2021

(54) FILAMENT AND LIGHTING DEVICE

(71) Applicant: OSRAM Opto Semiconductors GmbH, Regensburg (DE)

(72) Inventors: Thomas Schlereth, Pentling (DE); Hagen Luckner, Pentling (DE)

(73) Assignee: OSRAM OLED GmbH, Regensburg (DE)

( * ) Notice: Subject to any disclaimer, the term of this patent is extended or adjusted under 35 U.S.C. 154(b) by 187 days.

(21) Appl. No.: 16/303,887

(22) PCT Filed: May 23, 2017

(86) PCT No.: PCT/EP2017/062381
§ 371 (c)(1),
(2) Date: Nov. 21, 2018

(87) PCT Pub. No.: WO2017/202833
PCT Pub. Date: Nov. 30, 2017

(65) Prior Publication Data
US 2020/0278087 A1    Sep. 3, 2020

(30) Foreign Application Priority Data
May 25, 2016    (DE) .................... 10 2016 109 665.2

(51) Int. Cl.
*F21S 4/24*     (2016.01)
*F21K 9/232*    (2016.01)
*F21K 9/238*    (2016.01)
*F21K 9/64*     (2016.01)
*F21Y 115/10*   (2016.01)

(52) U.S. Cl.
CPC .............. *F21K 9/232* (2016.08); *F21K 9/238* (2016.08); *F21K 9/64* (2016.08); *F21S 4/24* (2016.01); *F21Y 2115/10* (2016.08)

(58) Field of Classification Search
CPC .. F21K 9/232; F21K 9/64; F21K 9/238; F21S 4/24; F21Y 2115/10
See application file for complete search history.

(56) References Cited

U.S. PATENT DOCUMENTS

| 2007/0153508 A1* | 7/2007 | Nall ................ H05B 45/20 362/219 |
| 2010/0320920 A1* | 12/2010 | Cheng ............... F21S 8/00 315/185 R |
| 2013/0155683 A1 | 6/2013 | Matsuda et al. |

(Continued)

FOREIGN PATENT DOCUMENTS

| CA | 3011602 A1 * | 6/2017 | ............ F21K 9/232 |
| CN | 203907532 U | 10/2014 | |

(Continued)

*Primary Examiner* — Donald L Raleigh
(74) *Attorney, Agent, or Firm* — DLA Piper LLP (US)

(57) ABSTRACT

A filament includes a plurality of strings including radiation-emitting semiconductor chips electrically connected in series; and a plurality of contact structures to contact the strings, wherein the contact structures electrically connect to semiconductor chips at ends of the strings such that the strings are electrically drivable via the contact structures, and the filament is configured such that the strings are electrically drivable at least separately from one another via the contact structures.

19 Claims, 15 Drawing Sheets

(56) References Cited

U.S. PATENT DOCUMENTS

| | | | |
|---|---|---|---|
| 2013/0201658 A1* | 8/2013 | Bogart | F21V 3/062 362/95 |
| 2013/0235592 A1 | 9/2013 | Takeuchi et al. | |
| 2014/0362565 A1 | 12/2014 | Yao et al. | |
| 2015/0008835 A1 | 1/2015 | Sugiura et al. | |
| 2015/0070871 A1 | 3/2015 | Chen et al. | |
| 2015/0117012 A1 | 4/2015 | Kuo et al. | |
| 2015/0276152 A1 | 10/2015 | Su et al. | |
| 2016/0327256 A1* | 11/2016 | Hall | F21S 8/036 |

FOREIGN PATENT DOCUMENTS

| | | | |
|---|---|---|---|
| CN | 104319345 A | 1/2015 | |
| CN | 104505455 A | 4/2015 | |
| CN | 105161608 A | 12/2015 | |
| DE | 20 2014 001 943 U1 | 5/2014 | |
| WO | WO-2016058592 A1 * | 4/2016 | H05B 45/44 |

\* cited by examiner

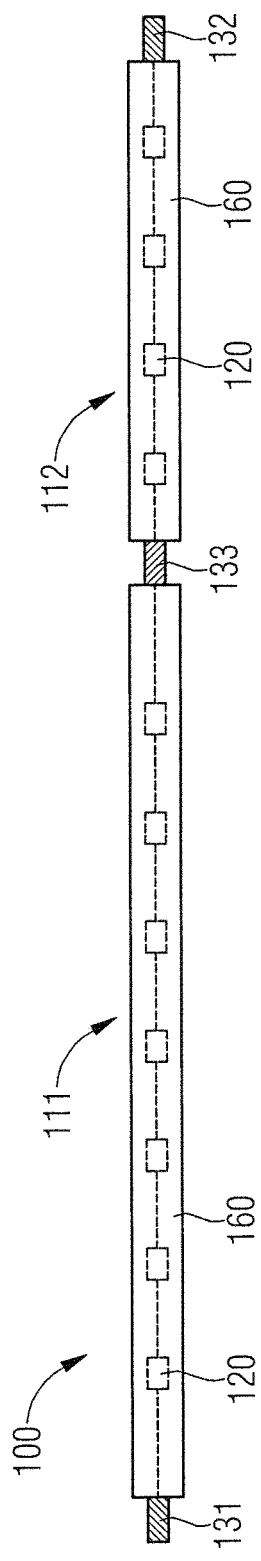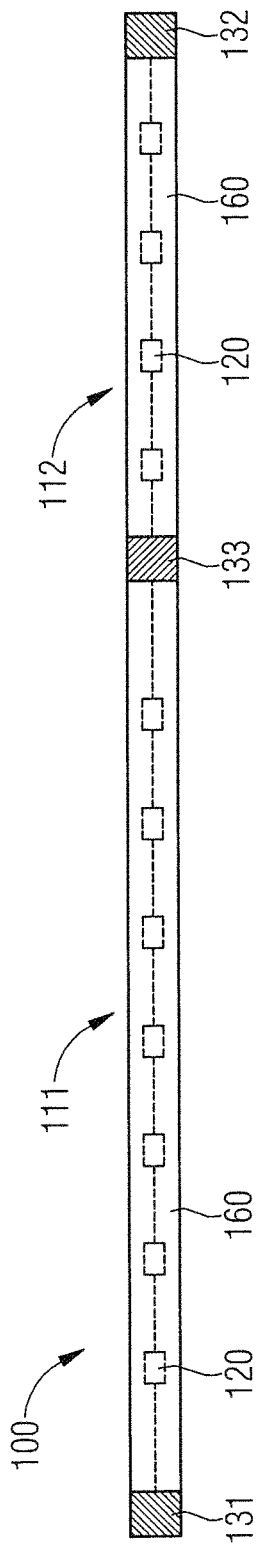

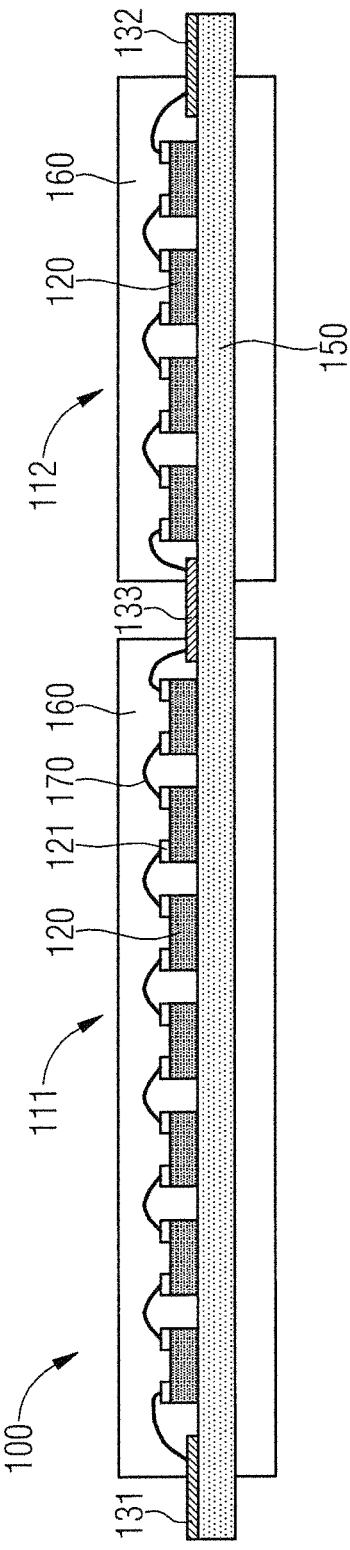
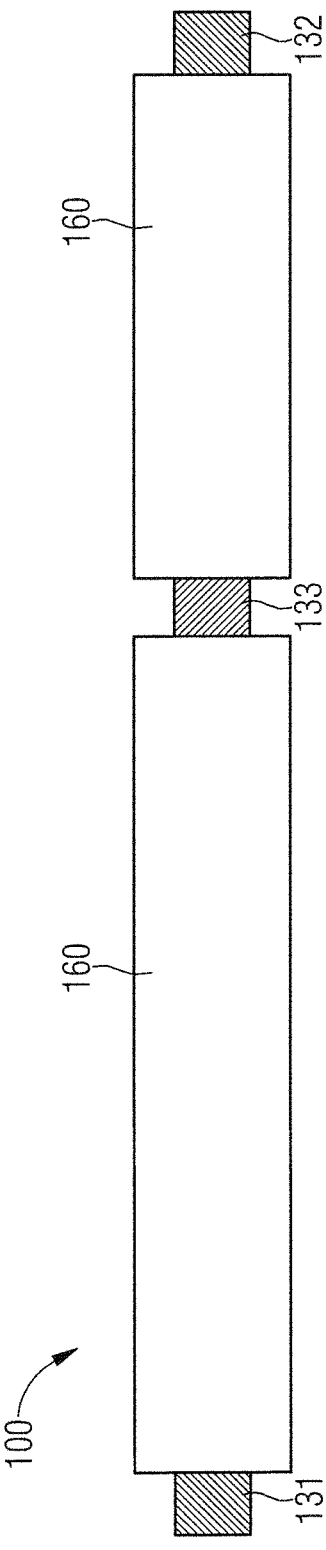
FIG 3
FIG 4

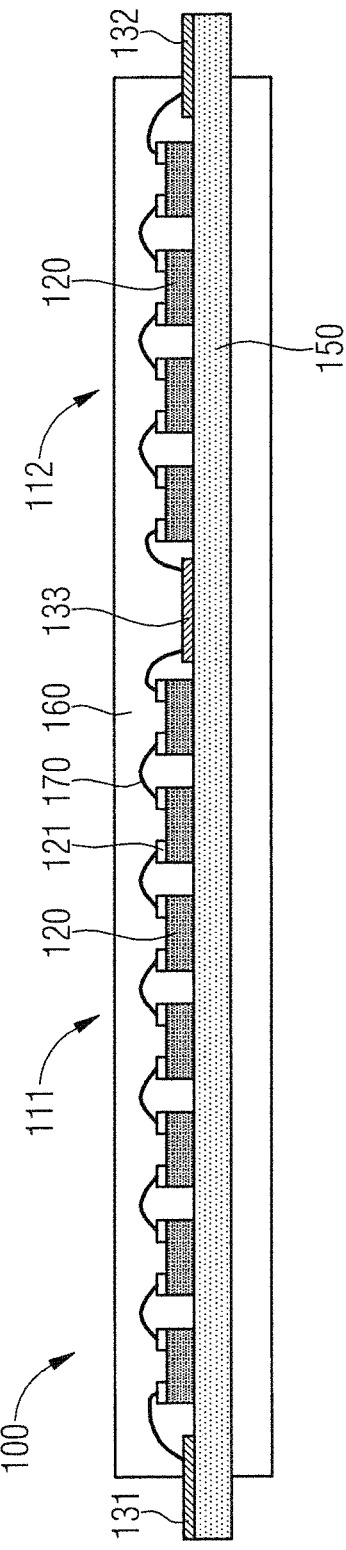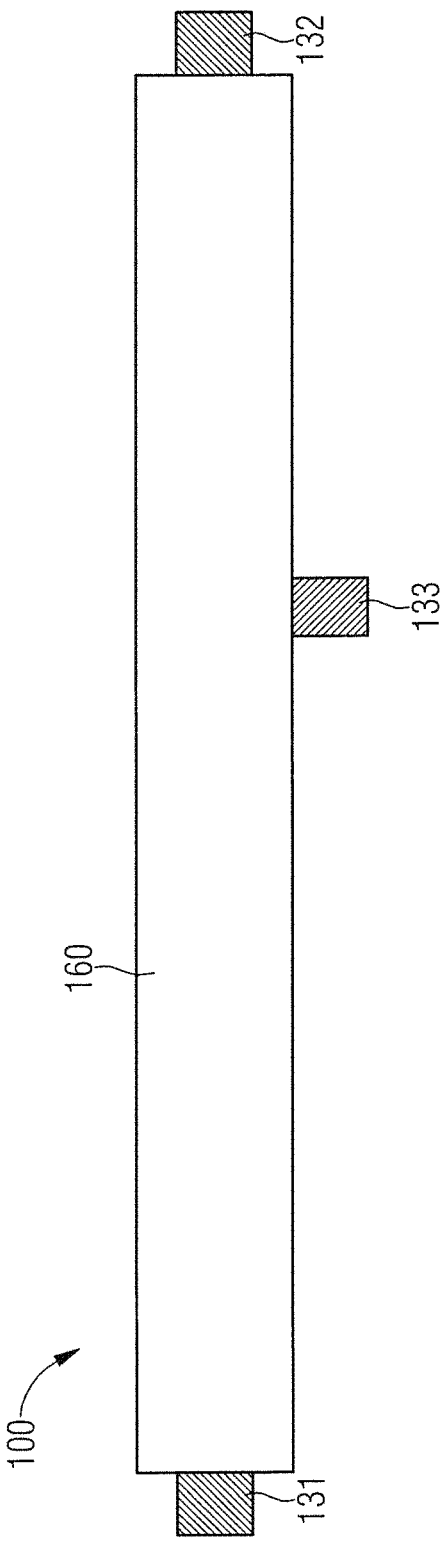

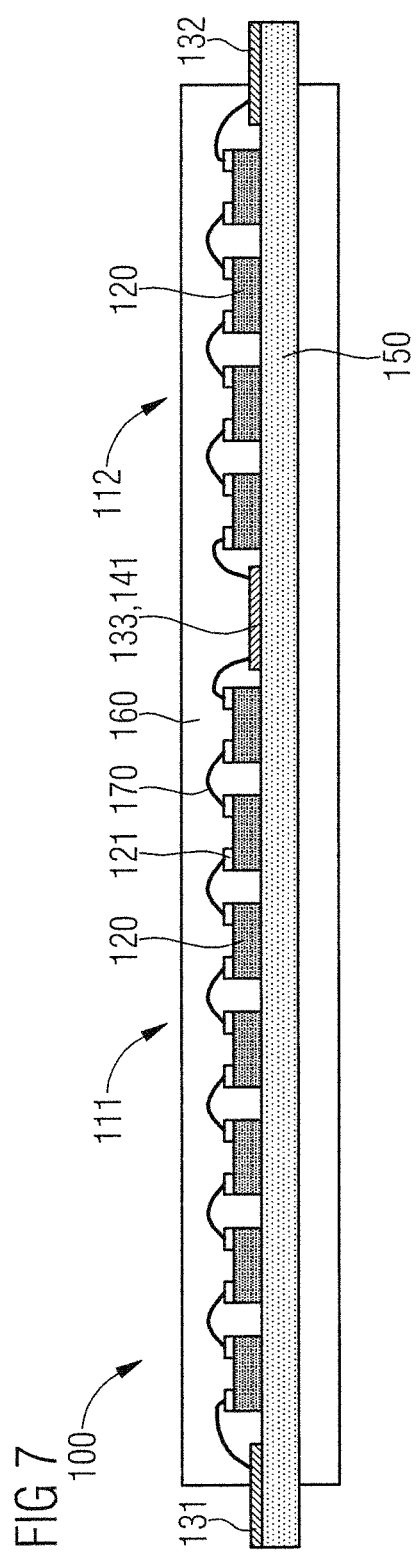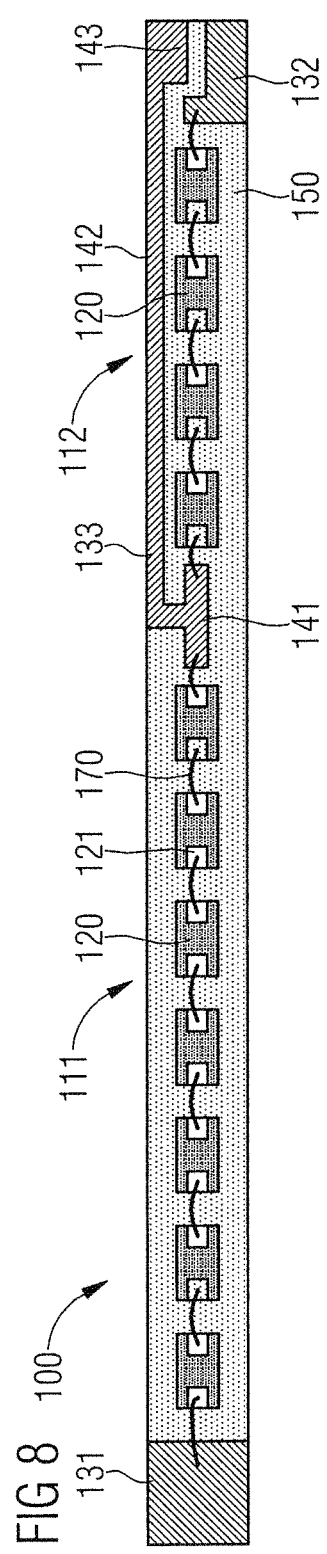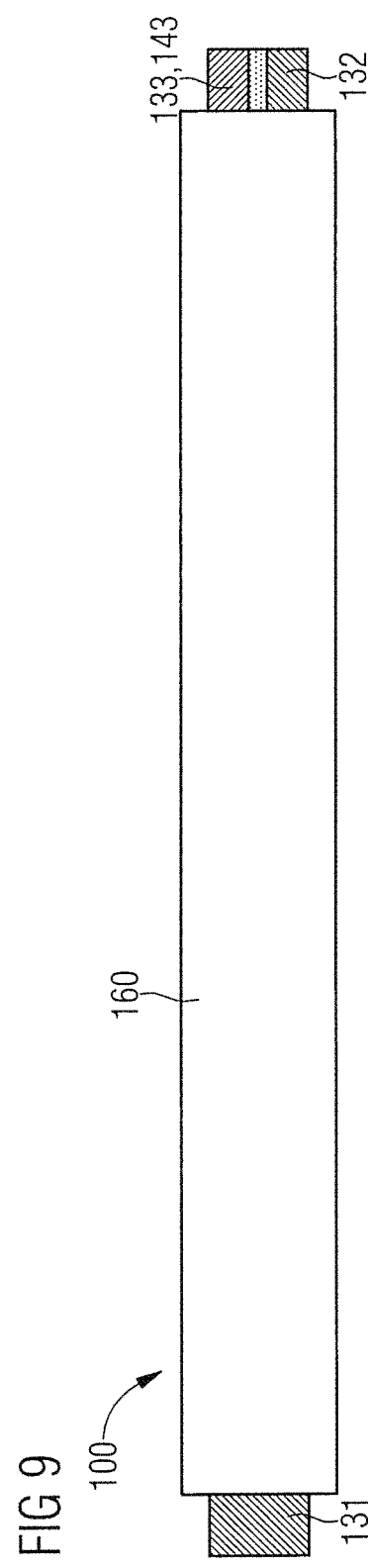

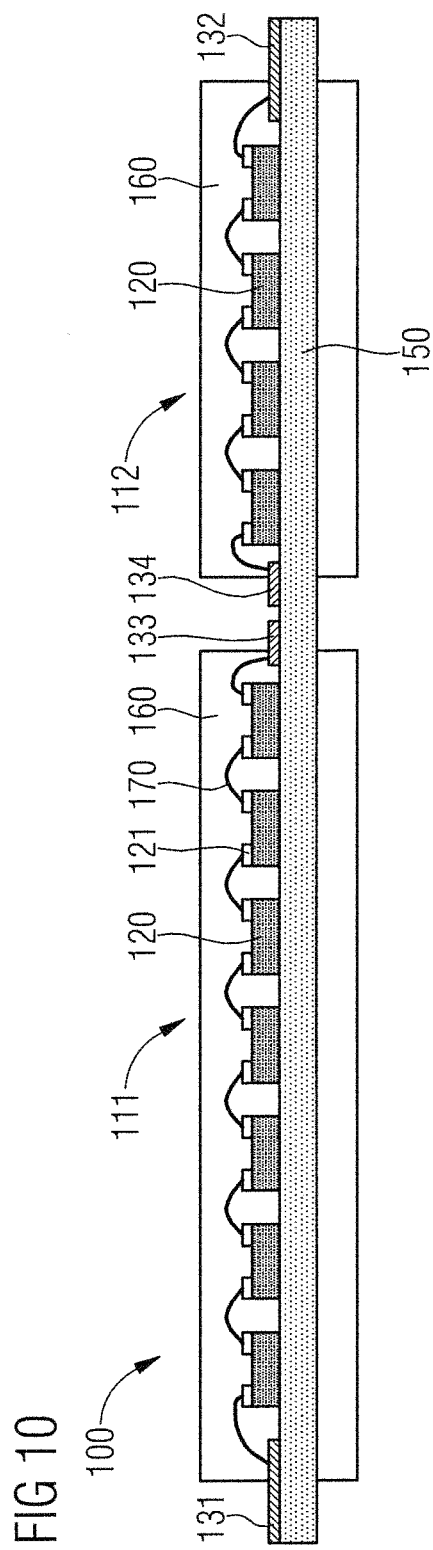
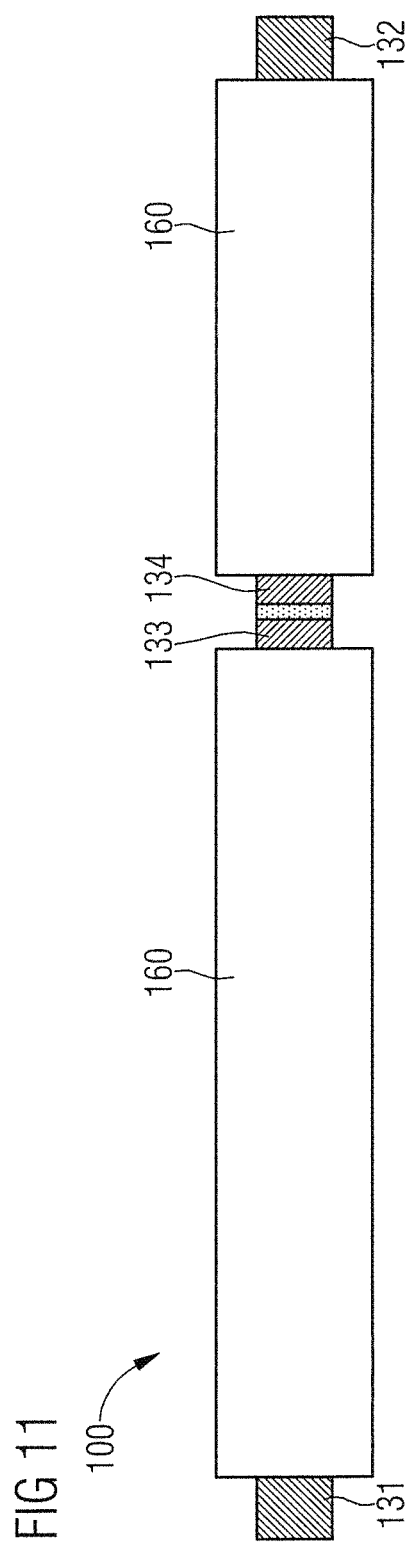

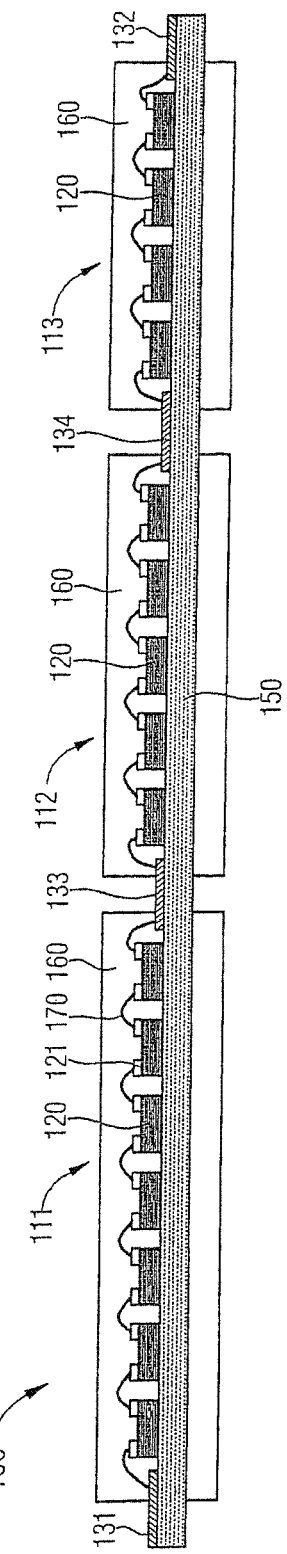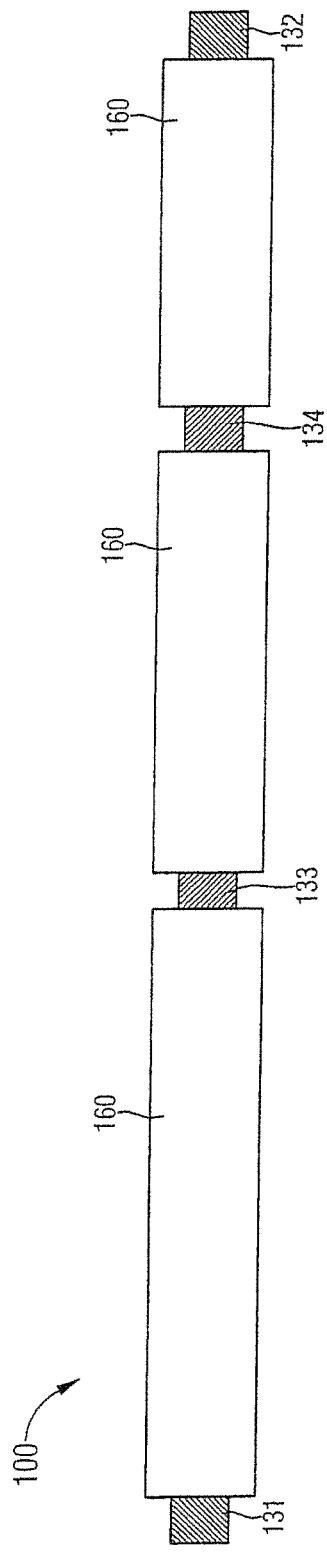

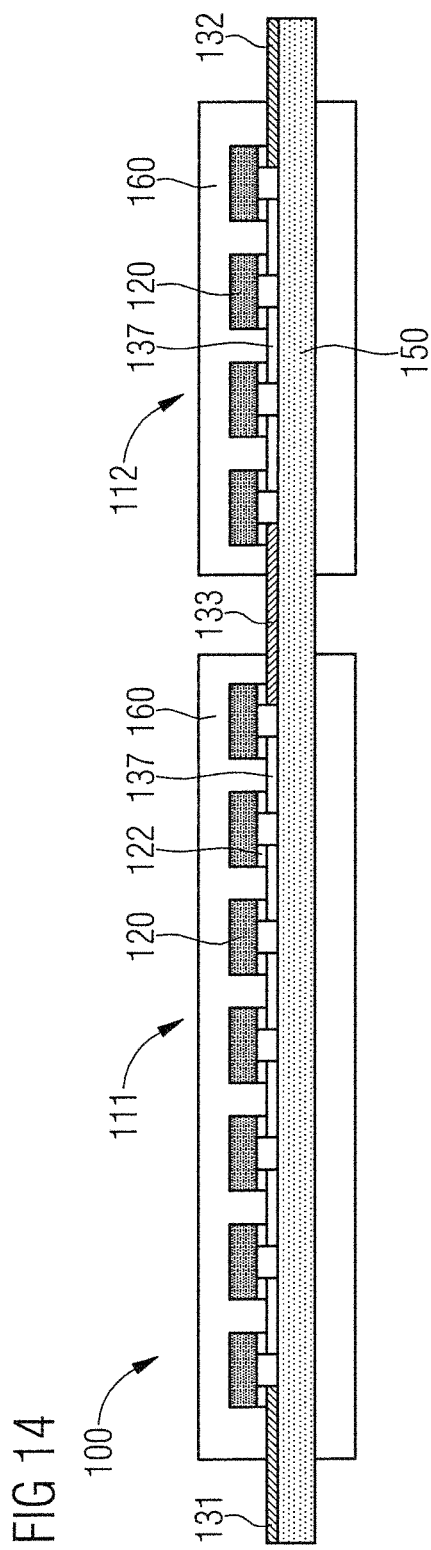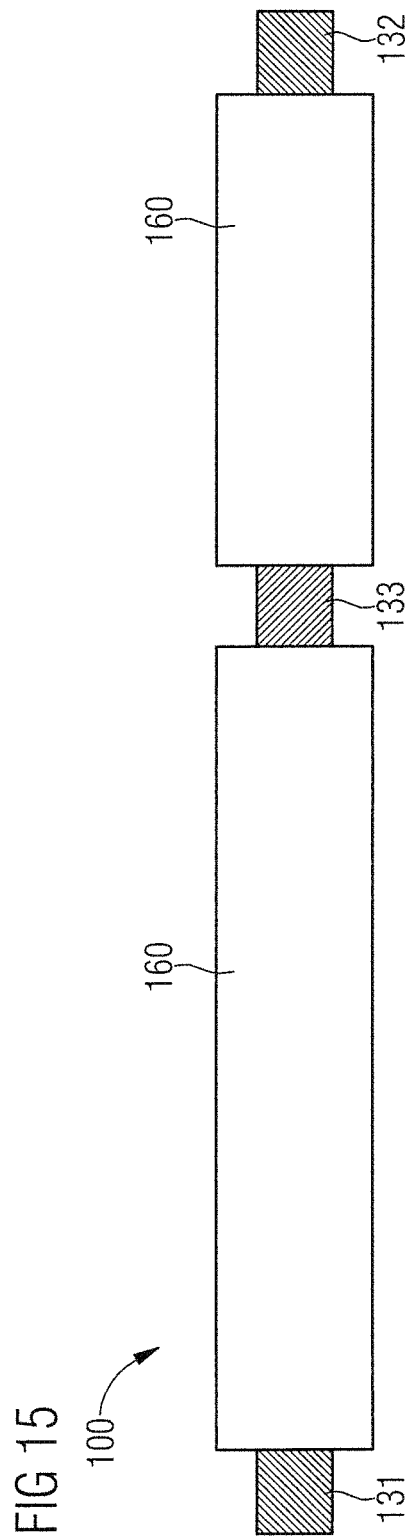

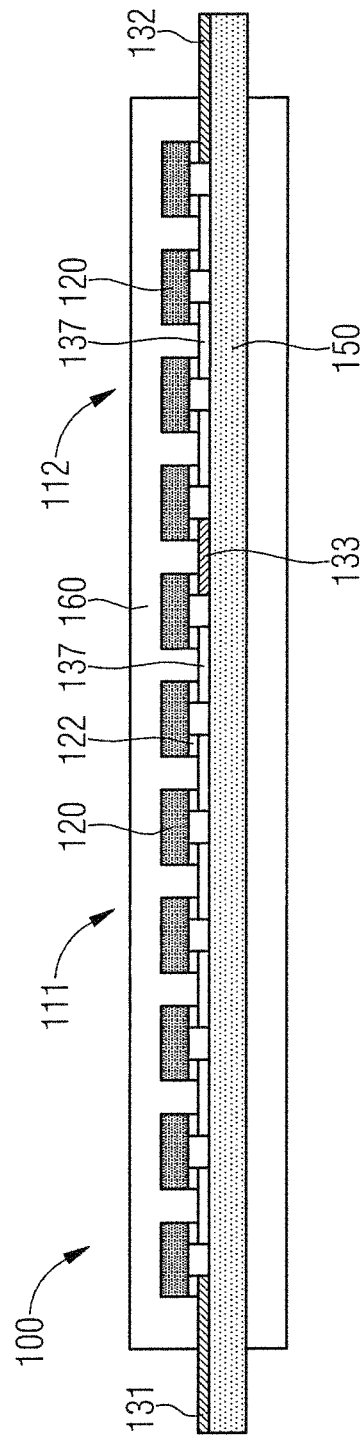
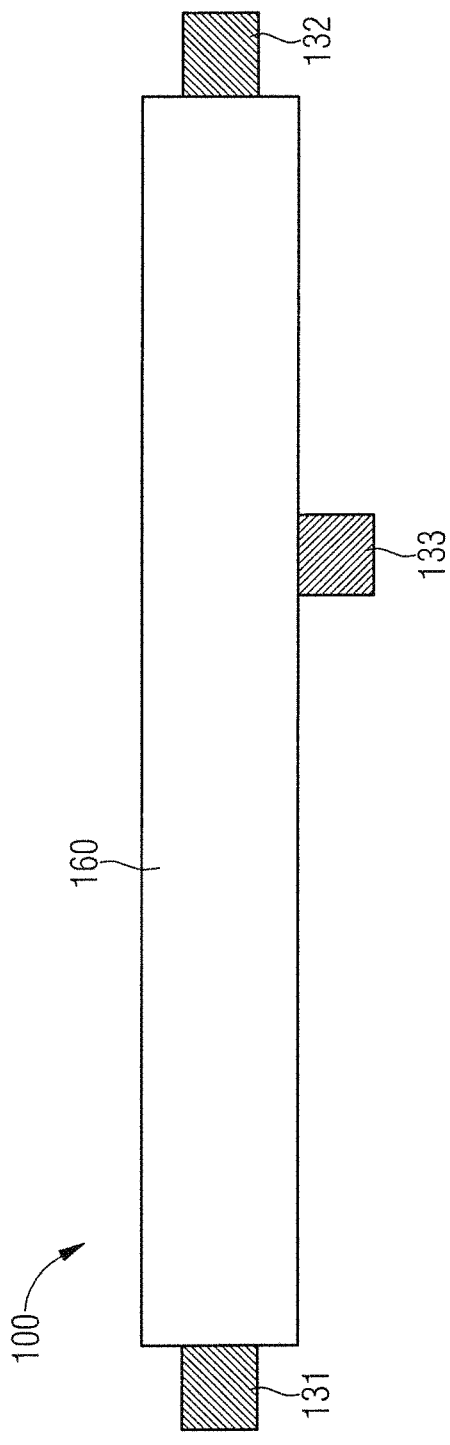

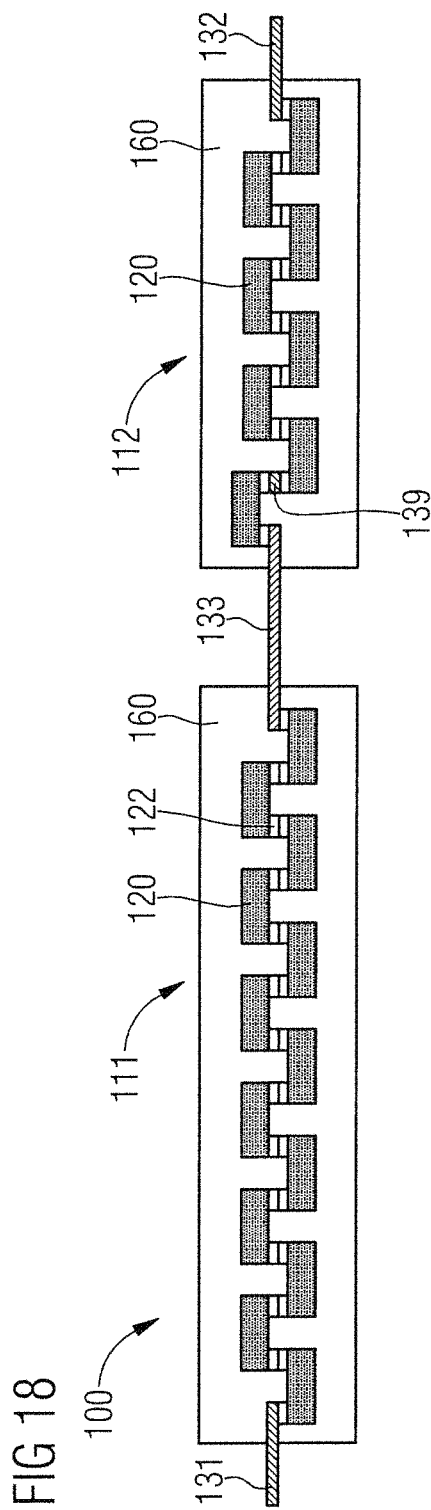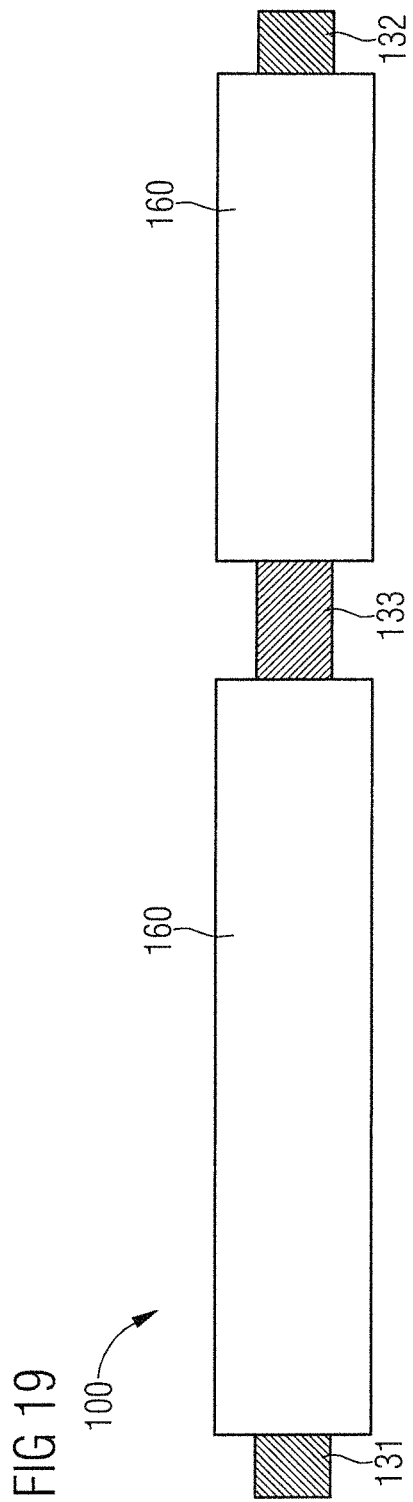

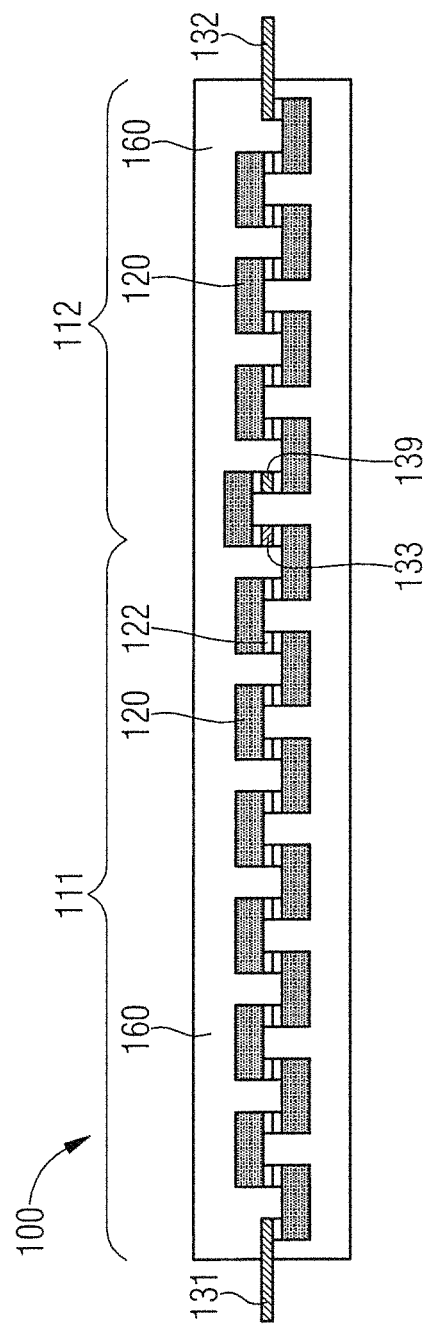

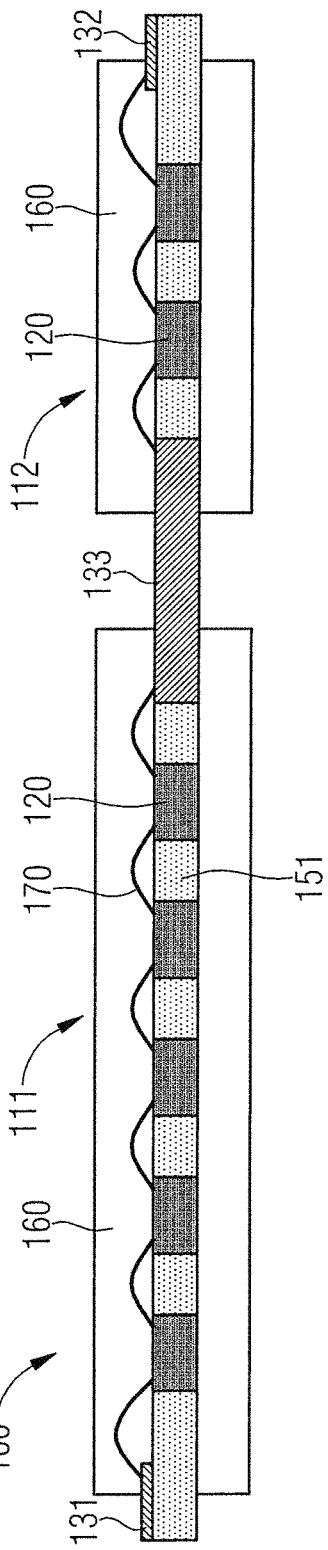
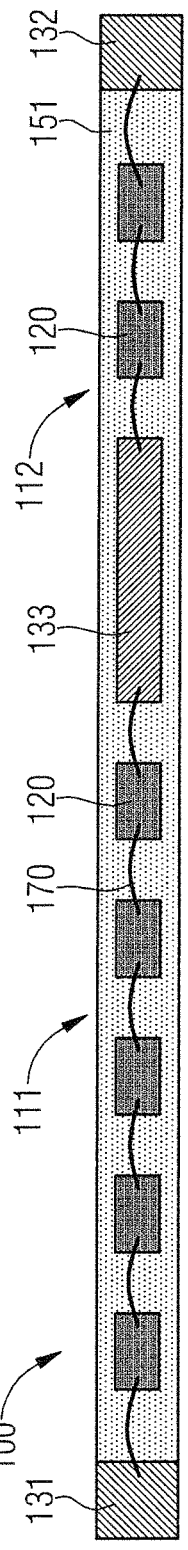
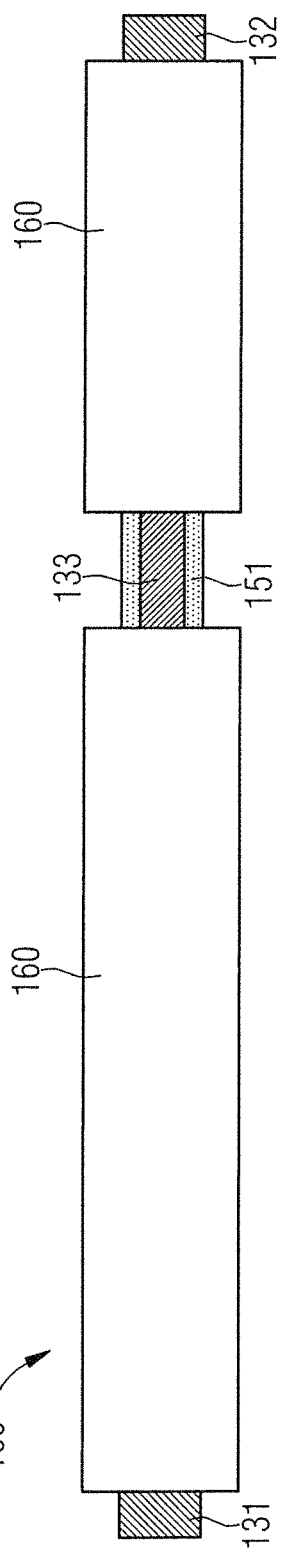

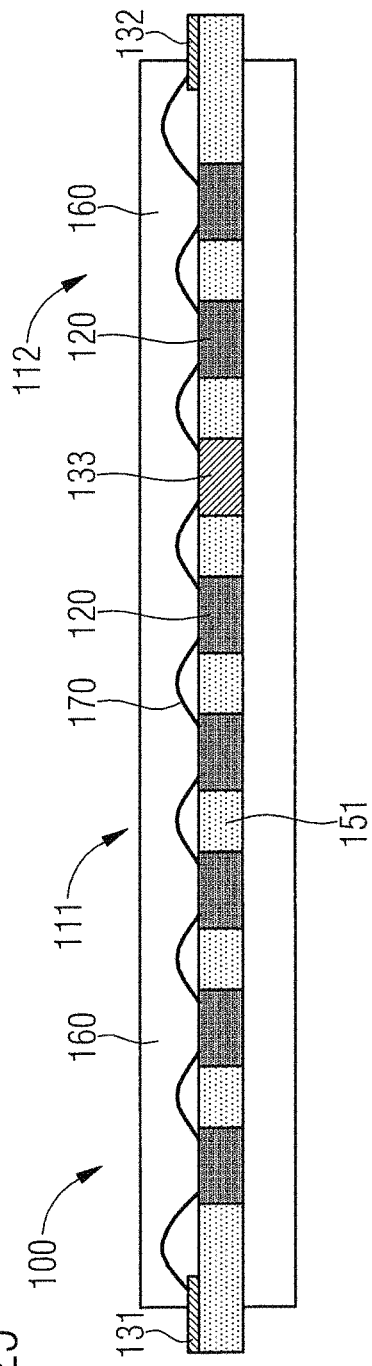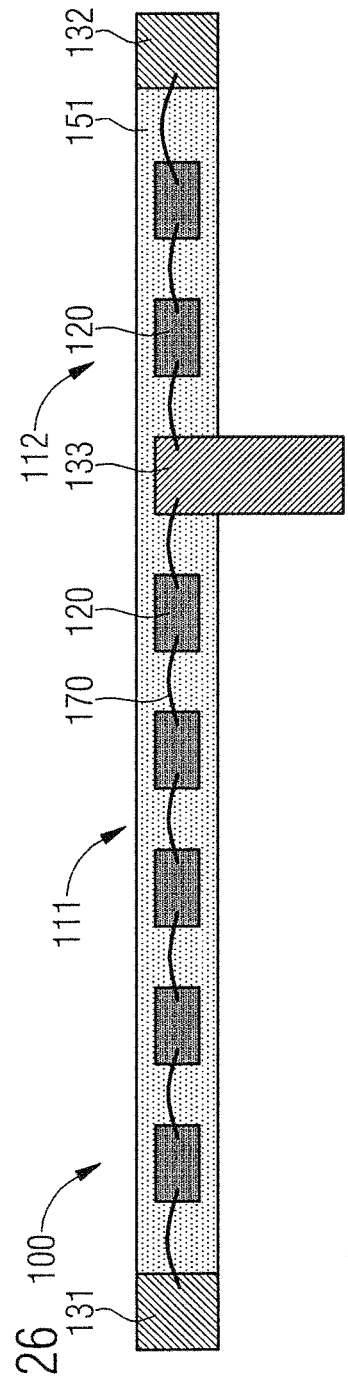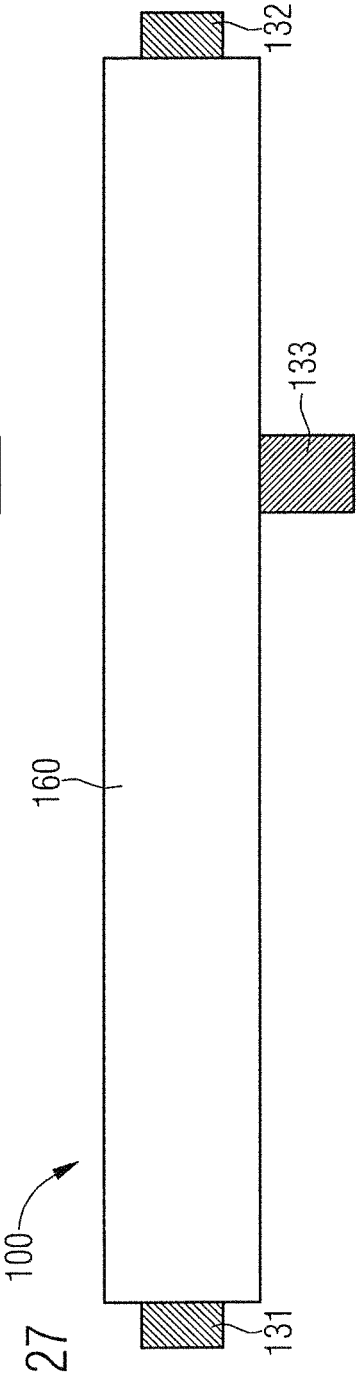

FILAMENT AND LIGHTING DEVICE

TECHNICAL FIELD

This disclosure relates to a filament comprising radiation-emitting semiconductor chips and a lighting device comprising such a filament.

BACKGROUND

LED lamps (Light Emitting Diode) comprising light emitting diode chips are increasingly being used nowadays for lighting applications. They include so-called retrofit lamps that look similar to conventional incandescent lamps and may be used like conventional incandescent lamps. A retrofit lamp may comprise a plurality of LED filaments. The latter are components comprising a plurality of radiation-emitting semiconductor chips. The semiconductor chips of a filament may be arranged on a common linear substrate and electrically connected in series. Moreover, the semiconductor chips may be enclosed by a conversion layer for radiation conversion. For electrical contacting, the filament may comprise two contacts (anode, cathode) arranged at the opposite ends. The luminous effect of the filament equipped with semiconductor chips may be comparable to that of a traditional incandescent filament.

The LED filaments of retrofit lamps may be connected in series and/or in parallel with one another. Alongside the filaments, the retrofit lamps may furthermore comprise a driver circuit such that operation from an AC mains is possible. With the aid of the driver, the mains voltage may be converted such that a forward voltage suitable for the operation of the LED filaments may be provided. The efficiency is all the greater, the more closely the forward voltage provided may be adjusted to the mains voltage.

In retrofit lamps, one requirement consists of providing a predefined lumen packet with a sufficient accuracy during luminous operation. In general, the lumen packet is accorded a higher priority than the efficiency. This has the effect that a compromise is made with regard to the voltage attained and hence the efficiency.

There is nonetheless a need to provide an improved filament comprising radiation-emitting semiconductor chips and a corresponding lighting device.

SUMMARY

We provide a filament including a plurality of strings including radiation-emitting semiconductor chips electrically connected in series; and a plurality of contact structures to contact the strings, wherein the contact structures electrically connect to semiconductor chips at ends of the strings such that the strings are electrically drivable via the contact structures, and the filament is configured such that the strings are electrically drivable at least separately from one another via the contact structures.

We also provide a lighting device including the filament including a plurality of strings including radiation-emitting semiconductor chips electrically connected in series; and a plurality of contact structures to contact the strings, wherein the contact structures electrically connect to semiconductor chips at ends of the strings such that the strings are electrically drivable via the contact structures, and the filament is configured such that the strings are electrically drivable at least separately from one another via the contact structures.

BRIEF DESCRIPTION OF THE DRAWINGS

FIGS. 1 and 2 show a schematic lateral illustration and a schematic plan view illustration of a filament comprising two series-connected strings of semiconductor chips, a conversion layer and a contact structure accessible between the strings.

FIGS. 3 and 4 show a schematic lateral illustration and a schematic plan view illustration of a further filament comprising a carrier comprising semiconductor chips comprising front-side contacts, the semiconductor chips being arranged on the carrier.

FIGS. 5 and 6 show a schematic lateral illustration and a schematic plan view illustration of a further filament comprising a contact structure projecting laterally from a conversion layer.

FIGS. 7 to 9 show a schematic lateral illustration and schematic plan view illustrations of a further filament comprising a contact structure extending as far as one end of the filament.

FIGS. 10 and 11 show a schematic lateral illustration and a schematic plan view illustration of a further filament comprising electrically isolated strings of semiconductor chips.

FIGS. 12 and 13 show a schematic lateral illustration and a schematic plan view illustration of a further filament comprising three series-connected strings of semiconductor chips.

FIGS. 14 and 15 show a schematic lateral illustration and a schematic plan view illustration of a further filament comprising two series-connected strings of semiconductor chips comprising rear-side contacts.

FIGS. 16 and 17 show a schematic lateral illustration and a schematic plan view illustration of a further filament comprising a contact structure projecting laterally from a conversion layer.

FIGS. 18 and 19 show a schematic lateral illustration and a schematic plan view illustration of a further filament comprising strings of semiconductor chips arranged alternately side-inverted with respect to one another.

FIGS. 20 and 21 show a schematic lateral illustration and a schematic plan view illustration of a further filament comprising semiconductor chips arranged alternately side-inverted with respect to one another and a contact structure projecting laterally from a conversion layer.

FIGS. 22 to 24 show a schematic lateral illustration and schematic plan view illustrations of a further filament comprising a carrier laterally surrounding semiconductor chips.

FIGS. 25 to 27 show a schematic lateral illustration and schematic plan view illustrations of a further filament comprising a carrier laterally surrounding semiconductor chips and a contact structure projecting laterally from a conversion layer.

LIST OF REFERENCE SIGNS

Figure 28:
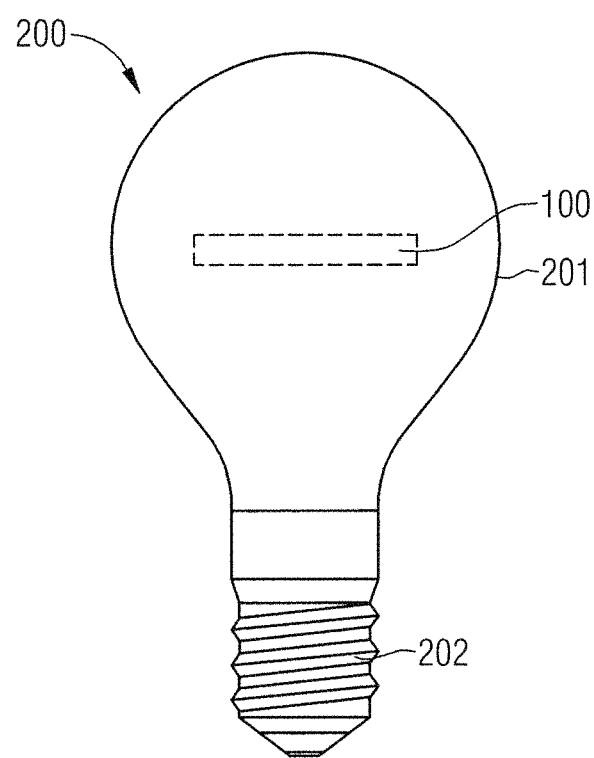
FIG. 28 shows a retrofit lamp comprising a filament.

100 Filament
111 String
112 String
113 String
120 Semiconductor chip
121 Contact 122 Contact
131 Contact structure
132 Contact structure
133 Contact structure
134 Contact structure
137 Contact structure
139 Compensation element
141 Section
142 Section
143 Section
150 Carrier
151 Carrier
160 Conversion layer
170 Bond wire
200 Retrofit lamp
201 Bulb
202 Lamp base
210 Driver unit
220 Driver
225 Voltage source
231 Voltage profile
232 Voltage profile

DETAILED DESCRIPTION

Our filament comprises a plurality of strings of radiation-emitting semiconductor chips electrically connected in series. Furthermore, the filament comprises a plurality of contact structures for electrically contacting the strings. The contact structures electrically connect to semiconductor chips at the ends of the strings such that the strings may be electrically driven via the contact structures.

The configuration of the filament comprising the plurality of strings, i.e., at least two strings, comprising semiconductor chips connected in series, wherein the strings may be electrically contacted via the contact structures, affords high flexibility with regard to an electrical interconnection and driving of the filament. Consequently, the interconnection of the filament may be controlled largely independently of a predefined lumen packet such that an efficient mode of operation is possible. Depending on the configuration of the filament, it is possible, for example, to provide during operation a forward voltage adjusted as closely as possible to a mains voltage (for example, comprising a root-mean-square value of 230V, 110V or 120V). The filament may be employed in a lighting device configured as a retrofit lamp. In this case, the filament, if appropriate with further filaments that are identical structurally, if appropriate, may connect to a driver.

Further possible details and examples that may be considered for the filament are described more specifically hereinafter.

The radiation-emitting semiconductor chips of the strings of the filament may be arranged along a common fictitious line, for example, along a straight line. This configuration may be relative to a plan view of the filament. In the same way, the filament may comprise a configuration extending along a fictitious and, for example, straight line.

The contact structures are electrically conductive and configured, for example, from a metallic material. Furthermore, the contact structures are accessible such that the contact structures may be electrically contacted and the strings may thus be electrically driven via the contact structures. The filament may be configured such that the strings may be electrically driven at least separately from one another. Depending on the configuration of the filament, a plurality or all of the strings of the filament may also be driven jointly. The following configurations may furthermore be considered in this context.

The filament may comprise a plurality of strings comprising radiation-emitting semiconductor chips electrically connected in series to constitute a series circuit. In this case, two contact structures electrically connect to semiconductor chips at the ends of the series circuit. Furthermore, at least one further contact structure is present, via which two strings of the series circuit electrically connect in series. The at least one further contact structure may serve as an intermediate tap. This configuration enables flexible electrical driving of the filament. In this case, optionally just one string or a plurality or all of the strings of the filament jointly may be supplied with electrical energy and thereby operated.

The following features and details may furthermore be applied with regard to the example mentioned above. The filament may be realized with two filaments electrically connected in series and may consequently comprise only one further contact structure via which the two strings electrically connect in series. The two strings may comprise adjacent or opposite ends, and the further contact structure may electrically connect to semiconductor chips at the ends. The filament may also be realized with a greater number of strings connected in series and in this respect with a correspondingly greater number of further contact structures. In each case, two adjacent strings may electrically connect in series via a further contact structure. The relevant two strings may each comprise adjacent or opposite ends, and the associated further contact structure may electrically connect to semiconductor chips at the ends.

The filament may comprise a plurality of strings comprising electrically isolated radiation-emitting semiconductor chips. In each of the isolated strings, two contact structures electrically connect to semiconductor chips at the ends of the relevant string. This configuration, too, enables flexible electrical driving of the filament. In this case, optionally just one string or a plurality or all of the strings of the filament together, although separately from one another, may be supplied with electrical energy and thereby operated.

The following configurations are furthermore possible with regard to the example mentioned above. The filament may be realized with two or a greater number of electrically isolated and thus independent strings. The two strings or each of two adjacent strings may comprise opposite ends. The semiconductor chips located at these locations may connect to respectively dedicated contact structures. In this case, two contact structures electrically connected to semiconductor chips of opposite ends of two adjacent strings may form a split tap.

At least two contact structures may be accessible and thereby contactable at the opposite ends of the filament. For when all of the strings of the filament connect to constitute a series circuit, two contact structures accessible at the ends of the filament may furthermore connect to semiconductor chips at the ends of the series circuit and thereby serve as primary contact structures with the aid of which all of the strings may be electrically driven in a common manner.

At least one contact structure may be accessible in a region between the opposite ends of the filament. In one configuration of the filament comprising strings connected in series, two adjacent strings may electrically connect via such a contact structure. In this case, the contact structure may be accessible in a region between the two adjacent strings, and serve as an intermediate tap. In one configuration of the filament comprising electrically isolated strings, two contact structures may be accessible in a region between two adjacent strings. The two contact structures may electrically connect to semiconductor chips at the ends of the adjacent strings, and serve as a split tap.

Two contact structures electrically connected to semiconductor chips at the ends of a string may be accessible at one end of the filament. In this configuration, the relevant string may be electrically contacted and driven with the aid of the contact structures that are accessible at the same end of the filament. At this end of the filament, if appropriate, at least one further contact structure electrically connected to a semiconductor chip at one end of a different string may also be present. On the basis of the example mentioned above, a configuration of the filament may be realized in which all of the contact structures of the filament are accessible only at the ends thereof. In this way the filament may comprise a homogeneous and symmetrical construction.

The radiation-emitting semiconductor chips of the filament may be light emitting diode chips (LED chips) such that the filament is an LED filament. Furthermore, the filament may be configured with a conversion material for radiation conversion. In this way, radiation generated by the semiconductor chips may be at least partly converted, and the filament may emit a light radiation composed of converted and non-converted radiation portions, for example, a white light radiation. The following configurations may furthermore be considered in this context.

The semiconductor chips of the strings may be covered with a conversion layer for radiation conversion. The conversion layer, which may be configured from one or more conversion materials, may enclose all of the semiconductor chips.

At least two contact structures at the ends of the filament may project from the conversion layer. As a result, the contact structures are accessible and thereby contactable at these locations. If all of the strings of the filament are connected to constitute a series circuit, two contact structures projecting from the conversion layer at the ends of the filament may serve as primary contact structures with the aid of which all of the strings may be jointly electrically operated.

At least one contact structure may project laterally from the conversion layer such that the relevant contact structure is accessible and contactable. In one configuration of the filament comprising strings connected in series, two adjacent strings may electrically connect via such a contact structure, and the contact structure may serve as an intermediate tap. In one configuration of the filament comprising electrically isolated strings, the filament may comprise two contact structures projecting laterally from the conversion layer that contact structures electrically connected to semiconductor chips at the ends of two adjacent strings and therefore serve as a split tap.

The semiconductor chips of the strings may each be covered with a separate layer section of the conversion layer, the layer section being assigned to a string. At least one contact structure is accessible in an intermediate region of two adjacent layer sections of the conversion layer. In a configuration of the filament comprising two strings, the filament comprises two layer sections, and in a configuration comprising a greater number of strings, the filament comprises a corresponding number of layer sections of the conversion layer. If the strings connect in series, two adjacent strings may electrically connect via a contact structure accessible in an intermediate region of the conversion layer, and the relevant contact structure may serve as an intermediate tap. In a configuration of the filament comprising electrically isolated strings, two contact structures may be accessible in an intermediate region of two adjacent layer sections of the conversion layer. The two contact structures may electrically connect to semiconductor chips at the ends of two adjacent strings and thus serve as a split tap.

The filament may comprise a carrier on which the semiconductor chips and the contact structures are arranged. The carrier may be configured from a radiation-transmissive material, for example, sapphire or a glass material. A non-transparent configuration of the carrier comprising a ceramic material, for example, is also possible. Furthermore, the carrier may comprise a linear shape, that is to say a shape extending along a fictitious, for example, straight line. This configuration may be relative to a plan view of the filament. The contact structures arranged on the carrier may be realized in the form of planar contact structures or contact pads.

The radiation-emitting semiconductor chips of the filament may comprise contacts via which the semiconductor chips may be contacted and supplied with electrical energy. In each semiconductor chip, the contacts may be arranged on the same chip side. The following configurations may furthermore be considered in this context.

The radiation-emitting semiconductor chips may comprise front-side contacts. In this case, the semiconductor chips may be arranged on a carrier and electrically connect in series among one another in the strings with the aid of bond wires. The semiconductor chips located at the ends of the strings may also connect to the associated contact structures via bond wires.

The radiation-emitting semiconductor chips may comprise rear-side contacts. In this case, the filament may comprise a carrier, which, in addition to the contact structures provided to electrically contact and drive the strings, may comprise further contact structures via which the semiconductor chips in the strings may electrically connect in series among one another. Via the rear-side contacts, the semiconductor chips may electrically and mechanically connect to the contact structures and the further contact structures. At these locations, the connection may be produced via an electrically conductive connection medium such as, for example, a solder or an electrically conductive adhesive.

In a further example, which may likewise be considered in a use of semiconductor chips with contacts on one chip side, the semiconductor chips of the strings may be arranged alternately side-inverted with respect to one another. This relates to front and rear sides of the semiconductor chips. In this case, the semiconductor chips or at least one portion of the semiconductor chips may electrically and mechanically connect to one another via their contacts. At these locations, the connection may be produced via an electrically conductive connection medium such as, for example, a solder or an electrically conductive adhesive.

A filament comprising semiconductor chips arranged alternately side-inverted may comprise strings electrically connected in series, for example. In this case, two adjacent strings may each connect via a contact structure by contacts of semiconductor chips at the ends of the adjacent string connecting to the contact structure. At such a location, the connection may be produced via an electrically conductive connection medium. If appropriate, between a semiconductor chip connected to a contact structure and a further semiconductor chip of the same string there may be arranged an additional electrically conductive or metallic compensation element, to which the two semiconductor chips connect. An enlarged distance possibly present at this location on account of the contact structure may be compensated for as a result.

In one configuration of the filament comprising electrically isolated strings comprising semiconductor chips arranged alternately side-inverted, contact structures to which semiconductor chips from the ends of two different adjacent strings connect may mechanically connect to one another, for example, via an insulating connection element that connects the contact structures. It is also possible for the electrically isolated strings to mechanically connect via a conversion layer.

The filament may comprise a carrier that laterally surrounds the semiconductor chips. Such a carrier may be produced by encapsulating the semiconductor chips and configured from a reflective material. The reflective material may be, for example, a plastics material comprising reflective particles embedded therein. Contact structures, for example, contact structures accessible at the ends of the filament may be arranged on the carrier. It is furthermore possible for at least one contact structure to be at least partly laterally surrounded by the carrier. This may be considered, for example, with regard to a contact structure serving as an intermediate tap. Furthermore, bond wires may be used via which the semiconductor chips in the strings may electrically connect in series among one another and the semiconductor chips located at the ends of the strings may connect to the associated contact structures.

The strings of the filament comprise a plurality of, i.e., at least two, semiconductor chips electrically connected in series. The strings of the filament may comprise different numbers of semiconductor chips. With the aid of this example, upon application of a suitable driver concept, an efficient mode of operation may be promoted. As a result of the different numbers of semiconductor chips in the strings, the strings may be driven such that a forward voltage provided is adjusted as closely as possible to a mains voltage.

We also provide a lighting device comprising a filament. The filament comprises the construction described above or a construction in accordance with one or more of the examples described above. On account of the configuration of the filament comprising the plurality of strings comprising radiation-emitting semiconductor chips electrically connected in series, wherein the strings are electrically contactable and drivable via contact structures, the filament may interconnect in the lighting device such that the filament may be operated with a high efficiency.

The lighting device may be a retrofit lamp. In this configuration, the lighting device may comprise a bulb within which the filament is arranged. A further possible constituent part is a lamp base configured with a screw thread to electrically contact the lighting device.

Our lighting device may comprise a driver connected to the filament, with the aid of which driver a mains voltage (AC voltage or mains AC voltage) may be converted into a forward voltage suitable for operation of the strings of the filament. The driver is configured to drive the strings of the filament in such a way, and thus to supply them with electrical energy such that the forward voltage is adjusted to the mains voltage. As was indicated above, on account of the construction of the filament it is possible to provide the forward voltage in a manner closely adapted to the mains voltage. In this way, an efficient mode of operation of the lighting device may be achieved, and losses during operation of the lighting device may be kept small.

With regard to the adaptation of the forward voltage to the mains voltage, the driver may be configured for optionally driving individual, a plurality or all of the strings of the filament. In this way, the forward voltage provided to operate the filament and applied to the filament or to the strings thereof may comprise a stepped course. In this case, with the aid of the driver, increasingly more semiconductor chips of the filament may each be electrically operated with increasing magnitude of the mains voltage (voltage absolute value). In the region of the maximum magnitude (peak volume) of the mains voltage, each of the strings and thus all of the semiconductor chips of the filament may be electrically operated. In a corresponding manner, increasingly fewer semiconductor chips of the filament may each be electrically operated with decreasing magnitude of the mains voltage. In the region of the zero crossings of the mains voltage, all of the strings and thus all of the semiconductor chips of the filament may not be operated.

The following examples may furthermore be applied with regard to a configuration of the lighting device comprising a driver.

The lighting device may comprise a multistage driver to drive the strings of the filament. A configuration of the filament comprising strings electrically connected in series may be applied with regard to this example. The multistage driver enables the strings to be driven such that a forward voltage provided is adjusted as closely as possible to a mains voltage.

The strings of the filament may interconnect in separate circuits. A configuration of the filament comprising electrically isolated strings may be applied with regard to this example. For the purpose of driving the strings, the lighting device may comprise driver units assigned to the individual strings and connected thereto. The driver units may be combined in a common driver. The common driver likewise enables the strings to be driven such that a forward voltage provided is adjusted as closely as possible to a mains voltage.

The lighting device may furthermore be configured with a plurality of filaments of the construction described above. The filaments may be structurally identical. Moreover, the filaments may interconnect in series and/or in parallel. On account of the construction of the filaments there are great freedoms for different series and/or parallel circuits. In this case, the interconnection may be controlled to the greatest possible extent independently of a predefined lumen packet.

The advantageous configurations and developments explained above may be applied (apart from, for example, in clear dependencies or incompatible alternatives) individually or else in arbitrary combination with one another.

The above-described properties, features and advantages and the way in which they are achieved will become clearer and more clearly understood in association with the following description of examples explained in greater detail in association with the schematic drawings.

Possible configurations of a filament 100 configured to emit light radiation are described with reference to the following schematic figures. The filaments 100, which can be used in a lighting device in the form of a retrofit lamp 200, comprise a construction such that a high flexibility with regard to different electrical interconnections and modes of operation is possible.

The figures are merely of schematic nature and are not true to scale. In this sense, components and structures shown in the figures may be illustrated with exaggerated size or size reduction to afford a better understanding. Moreover, the filaments 100 may be realized with different numbers of components shown such as semiconductor chips 120, for example. In the same way, the filaments 100 may comprise further components and structures besides components shown and described.

FIG. 1 shows a lateral illustration, and FIG. 2 shows a plan view illustration of a light emitting filament 100. The construction shown here may be regarded as a basic principle on which the configurations of a filament 100 described with reference to the subsequent figures are based and from which the configurations may be derived. The filament 100 comprises two strings 111, 112 of radiation-emitting semiconductor chips 120 electrically connected in series. The two strings 111, 112 comprise different numbers of semiconductor chips 120. Furthermore, the strings 111, 112 themselves electrically connect in series to constitute a series circuit. All of the semiconductor chips 120 of the filament 100 are arranged along a common straight line as seen in a plan view of the filament 100.

The filament 100 furthermore comprises a conversion layer 160 for radiation conversion, the conversion layer covering the semiconductor chips 120. In this case, the conversion layer 160 is subdivided into two separate layer sections assigned to the individual strings 111, 112, the semiconductor chips 120 being enclosed by the layer sections. The semiconductor chips 120 that are not visible on account of the enveloping conversion layer 160 are indicated by dashed lines in FIGS. 1 and 2.

The semiconductor chips 120 may be light emitting diode chips. With the aid of the conversion layer 160, a primary light radiation generated by the semiconductor chips 120 during operation may be at least partly converted into one or more secondary light radiations. In this way, the filament may emit a light radiation that may comprise primary and secondary, that is to say non-converted and converted, radiation portions. It is possible, for example, for the primary light radiation to be a blue light radiation converted into a yellow light radiation with the aid of the conversion layer 160 such that, by a superimposition of these light radiations, a white light radiation may be emitted by the filament 100. By way of example, a partial conversion of the blue light radiation into a red light radiation and into a green or yellow-green light radiation is also possible such that a white light radiation may likewise be generated by a superimposition.

For the purpose of electrical contacting and driving, the filament 100 shown in FIGS. 1 and 2 comprises three contact structures 131, 132, 133. The contact structures 131, 132, 133 configured from an electrically conductive or metallic material electrically connect to semiconductor chips 120 of the opposite ends of the two strings 111, 112.

Of the three contact structures, two contact structures 131, 132 electrically connect to semiconductor chips 120 at the ends of the series circuit comprising the two strings 111, 112. The two contact structures 131, 132 are located at the opposite ends of the filament 100 and are accessible at these locations. A further contact structure 133 is accessible in a region between the ends of the filament 100, specifically between the strings 111, 112 in an intermediate region between the separate layer sections of the conversion layer 160. The contact structure 133 electrically connects to semiconductor chips 120 of the mutually opposite ends of the two strings 111, 112 such that the strings 111, 112 electrically connect in series via the contact structure 133.

Construction of the filament 100 enables high flexibility with regard to an electrical interconnection and driving. The two contact structures 131, 132 at the end sides may be used as primary contact structures with the aid of which the two strings 111, 112 may be jointly supplied with electrical energy. The further contact structure 133 may be used as an intermediate tap to optionally operate only one of the strings 111, 112. In this case, the string 111 may be electrically driven with the aid of the contact structures 131, 133, and the other string 112 may be electrically driven with the aid of the contact structures 132, 133.

Further possible configurations and variants that may be considered for a light emitting filament 100 are described below. Corresponding features and advantages and also identical and identically acting components are not described in detail again hereinafter. For details in respect thereof, reference is instead made to the description above. Furthermore, aspects and details mentioned with regard to one configuration of a filament 100 may also be applied with regard to another configuration and features of two or more configurations may be combined with one another.

FIGS. 3 and 4 show a lateral sectional illustration and a plan view illustration of a further filament 100 comprising two strings 111, 112 of radiation-emitting semiconductor chips 120, the strings being electrically connected in series, and three contact structures 131, 132, 133 electrically connected to semiconductor chips 120 at the ends of the strings 111, 112. The two contact structures 131, 132, that can be used as primary contact structures electrically connect to semiconductor chips 120 at the ends of the series circuit comprising the two strings 111, 112. Semiconductor chips 120 of opposite ends of the strings 111, 112 connect to the contact structure 133 that can be used as an intermediate tap such that the strings 111, 112 connect in series via the contact structure 133.

The filament 100 shown in FIGS. 3 and 4 furthermore comprises a linear carrier 150, on which the semiconductor chips 120 and the contact structures 131, 132, 133 are arranged. The carrier 150 may be configured from a transparent material such as, for example, sapphire or a glass material. A non-transparent configuration of the carrier 150 comprising a ceramic material, for example, is also possible. The contact structures 131, 132, 133 arranged on the carrier 150 may be realized in the form of contact pads, as indicated in FIGS. 3 and 4.

FIG. 3 indicates one possible configuration of the semiconductor chips 120 each comprising two front-side contacts 121 to which bond wires 170 are connected. With the aid of the bond wires 170, the semiconductor chips 120 in the strings 111, 112 electrically connect in series among one another. In the same way, the semiconductor chips 120 located at the ends of the strings 111, 112 electrically connect to the associated contact structures 131, 132, 133 via bond wires 170. The semiconductor chips 120 may be secured on the carrier 150, for example, with the aid of an adhesive (not illustrated).

The filament 100 shown in FIGS. 3 and 4 furthermore comprises a conversion layer 160 subdivided into two layer sections assigned to the strings 111, 112. In this case, the carrier 150 in the region of the semiconductor chips 120 and the semiconductor chips 120 arranged on the carrier 150 together with bond wires 170 are enclosed by the conversion layer 160. The contact structures 131, 132, 133 are only partly covered with the conversion layer 160 and, in the contact structures 131, 132, together with the carrier 150 at the ends of the filament 100 project from the conversion layer 160 such that the contact structures 131, 132, 133 are accessible for contacting.

FIGS. 5 and 6 show a lateral sectional illustration and a plan view illustration of a further filament 100 comprising a slightly modified construction in comparison with FIGS. 3 and 4. This filament 100, too, comprises two strings 111, 112 of radiation-emitting semiconductor chips 120 comprising front-side contacts 121, the strings electrically connecting in series, and a carrier 150 comprising three contact structures 131, 132, 133. A further constituent part is a conversion layer 160 that encloses the carrier 150 in the region of the semiconductor chips 120 and the semiconductor chips 120 arranged on the carrier 150. In the configuration shown in FIGS. 5 and 6, the conversion layer 160 is not subdivided into separate layer sections, but rather comprises a continuous form.

A further difference of the filament 100 shown in FIGS. 5 and 6 consists of the configuration of the contact structure 133. The contact structure 133, that electrically connects to semiconductor chips 120 of the opposite ends of the two strings 111, 112, projects laterally from the conversion layer 160. In this way, the contact structure 133 at this location is accessible for contacting and may therefore be used as a lateral intermediate tap. It is possible, if appropriate, for the carrier 150 to also comprise a partial section that laterally projects from the conversion layer 160 and on which the contact structure 133 is arranged (not illustrated).

FIGS. 7 to 9 show a lateral sectional illustration and two plan view illustrations of a further filament 100 comprising two strings 111, 112 of semiconductor chips 120 comprising front-side contacts 121, the strings electrically connected in series, a carrier 150 comprising three contact structures 131, 132, 133 and a continuous conversion layer 160 that encloses the carrier 150 in the region of the semiconductor chips 120 and the semiconductor chips 120. The plan view illustration in FIG. 8 shows the filament 100 without the conversion layer 160. This makes it clear that the contact structure 133 serving as an intermediate tap comprises a shape drawn toward the side and extending to one end of the filament 100.

In this case, the contact structure 133 comprises a section 141 between the strings 111, 112, to which section semiconductor chips 120 at the opposite ends of the two strings 111, 112 electrically connect via bond wires 170. Furthermore, the contact structure 133 comprises a planar section 143 accessible at one end of the filament 100 and not covered with the conversion layer 160. The sections 141, 143 connect via a further section 142 of the contact structure 133, the further section extending in a manner proceeding from the section 141 laterally with respect to the semiconductor chips 120 of the string 112 as far as the section 143 on the end side. At this end of the filament 100, the contact structure 132 is furthermore located laterally with respect to the section 143. As illustrated in FIG. 8, the contact structure 132 may comprise a, for example, L-shaped plan view shape adapted to the section 143.

In the filament 100 shown in FIGS. 7 to 9 as well, the contact structures 132, 133 electrically connect to semiconductor chips 120 at the opposite ends of the string 112 such that the string 112 may be electrically driven via the contact structures 132, 133. In contrast to the configurations described above, however, the two contact structures 132, 133 are accessible for contacting at the same end of the filament 100.

In one possible modification (not illustrated), a filament 100 may be configured such that the contact structure 133, in a departure from FIG. 8, extends to the opposite end of the filament 100, and the contact structures 131, 133 are accessible at the same end of the filament 100. In this case, the contact structure 131 may comprise an adapted, for example, L-shaped plan view shape.

FIGS. 10 and 11 show a lateral sectional illustration and a plan view illustration of a further filament 100 comprising two strings 111, 112 of series-connected semiconductor chips 120, a carrier 150 and a conversion layer 160 subdivided into two separate layer sections assigned to the strings 111, 112. In contrast to the configurations described above, the strings 111, 112 are not connected in series, but rather are electrically isolated from one another. Therefore, four electrically conductive or metallic contact structures 131, 132, 133, 134 are arranged on the carrier 150. The contact structures may be realized in the form of contact pads as indicated in FIGS. 10 and 11.

In each string 111, 112, two contact structures electrically connect to semiconductor chips 120 at the opposite ends of the relevant string 111, 112, specifically the contact structures 131, 133 in the string 111 and the contact structures 132, 134 in the string 112. The contact structures 131, 132 are located at the ends of the filament 100, and project at these locations together with the carrier 150 from the layer sections of the conversion layer 160 such that the contact structures 131, 132 are accessible. The other contact structures 133, 134 that electrically connect to semiconductor chips 120 at the opposite ends of the different strings 111, 112 are accessible between the strings 111, 112 in an intermediate region between the layer sections of the conversion layer 160 and project from the layer sections of the conversion layer 160 at this location. The contact structures 133, 134 form a split tap.

The filament 100 once again comprises as shown in FIG. 10 semiconductor chips 120 comprising front-side contacts 121. Electrical connections between the semiconductor chips 120 in the strings 111, 112 and also between semiconductor chips 120 at the ends of the strings 111, 112 and the contact structures 131, 132, 133, 134 are produced via bond wires 170.

The filament 100 comprising the electrically isolated strings 111, 112 of semiconductor chips 120 as depicted in FIGS. 10 and 11 likewise affords high flexibility with regard to an electrical interconnection and driving. It is optionally possible to electrically drive and operate just one string 111, 112 with the aid of the associated contact structures, i.e., the string 111 with the aid of the contact structures 131, 133 or the string 112 with the aid of the contact structures 132, 134. It is also possible to drive both strings 111, 112 together, although separately from one another, via the associated contact structures 131, 132, 133, 134.

For a filament 100 comprising electrically isolated strings 111, 112, alternative configurations are possible in which features of the designs described above may be applied. By way of example, in a departure from FIGS. 10 and 11, such a filament 100 may be realized with a continuous conversion layer 160. With regard to contact structures 133, 134 electrically connected to semiconductor chips 120 of opposite ends of different strings 111, 112 and used as a split tap, a configuration corresponding to the filament 100 shown in FIGS. 5 and 6 is possible. In this case, the contact structures 133, 134 may project laterally from the conversion layer 160 and thereby be accessible for contacting. A carrier 150 of the filament 100 may, if appropriate, comprise partial sections that project laterally 0 from the conversion layer 160 and on which the contact structures 133, 145 are arranged (not illustrated).

Furthermore, a construction comparable to FIGS. 7 to 9 may be considered for a filament 100 comprising electrically isolated strings 111, 112. In this case, too, the filament 100 may comprise a continuous conversion layer 160. Contact structures 133, 134 that electrically connect to semiconductor chips 120 of opposite ends of different strings 111, 112 and serve as a split tap may be configured such that each contact structure 133, 134 extends to an end of the filament 100. This may involve the opposite ends of the filament 100. At each of these locations, a further contact structure 131 or 132, respectively, may be present and accessible, which electrically connects to a semiconductor chip 120 of an opposite end of the relevant string 111 or 112, respectively. In this configuration, the strings 111, 112 may be electrically driven with the aid of contact structures 131, 133 or 132, 134, respectively, that are each accessible at the same end of the filament 100 (not illustrated).

It is furthermore possible to realize a filament 100 not just comprising two but comprising a greater number of strings of semiconductor chips 120 and, consequently, comprising multiple intermediate taps or split taps. For exemplary illustration, FIGS. 12 and 13 show a lateral sectional illustration and a plan view illustration of a further filament 100 comprising a construction comparable to FIGS. 3 and 4. The filament 100 comprises three strings 111, 112, 113 comprising different numbers of radiation-emitting semiconductor chips 120, the strings electrically connected in series, and four contact structures 131, 132, 133, 134 electrically connected to semiconductor chips 120 at the ends of the strings 111, 112, 113. The semiconductor chips 120 and the contact structures 131, 132, 133, 134 are arranged on a carrier 150. The contact structures 131, 132, 133, 134 may be realized in the form of contact pads. Electrical connections between the semiconductor chips 120 in the strings 111, 112, 113 among one another and between semiconductor chips 120 at the ends of the strings 111, 112, 113 and associated contact structures 131, 132, 133, 134 are produced via bond wires 170 connected to front-side contacts 121 of the semiconductor chips 120. A further constituent part of the filament 100 is a conversion layer 160 enclosing the carrier 150 and the semiconductor chips 120, which conversion layer in this case is subdivided into three layer sections assigned to the strings 111, 112, 113.

As shown in FIG. 12, two contact structures 131, 132 electrically connect to semiconductor chips 120 at opposite ends of the series circuit comprising the three strings 111, 112, 113. The two contact structures 131, 132 are located at the opposite ends of the filament 100 and project from the conversion layer 160 at these locations, as a result of which the contact structures 131, 132 are accessible for electrical contacting. The further contact structures 133, 134, which like the contact structures 131, 132 are only partly covered with the conversion layer 160, are accessible between the strings 111, 112, 113 in intermediate regions between the separate layer sections of the conversion layer 160. In this case, the contact structure 133 is located between the two adjacent strings 111, 112, and electrically connects to semiconductor chips 120 of the opposite ends of the strings 111, 112. The other contact structure 134 is located between the two adjacent strings 112, 113, and electrically connects to semiconductor chips 120 of the opposite ends of the strings 112, 113. In this way, the respectively adjacent strings 111, 112 and 112, 113, and thus all of the strings 111, 112, 113, electrically connect in series via the contact structures 133, 134.

The two contact structures 131, 132 at the end sides may be used as primary contact structures with the aid of which all of the strings 111, 112, 113 of the filament 100 may be jointly supplied with electrical energy. The further contact structures 133, 134 may be used as intermediate taps to optionally electrically drive just a single string 111, 112, 113, or a portion, i.e., two, of the strings 111, 112, 113.

Alternative configurations may also be considered with regard to the filament 100 comprising three strings 111, 112, 113 of semiconductor chips 120 as shown in FIGS. 12, 13. By way of example, a configuration corresponding to the construction shown in FIGS. 5 and 6 is possible. In this case, the filament 100 may comprise a continuous conversion layer 160 and contact structures 133, 134, that serve as intermediate taps and electrically connect to semiconductor chips 120 of opposite ends of two adjacent strings 111, 112 and 112, 113, respectively, may project laterally from the conversion layer 160 (not illustrated).

Furthermore, a construction comparable to FIGS. 7 to 9 is possible. In this case, too, the filament 100 may comprise a continuous conversion layer 160. Contact structures 133, 134, that serve as intermediate taps may be configured such that the contact structures 133, 134 extend to opposite ends of the filament 100. In this way, at one end of the filament 100 two contact structures 131, 133 and at the other end of the filament 100 two contact structures 132, 134 may be accessible and thereby electrically contactable (not illustrated).

Furthermore, a construction of a filament 100 comprising three electrically isolated strings 111, 112, 113 comparable to FIGS. 10 and 11 may also be considered. In this case, the filament 100 comprises a total of six contact structures, and each string 111, 112, 113 is assigned two contact structures that electrically connect to semiconductor chips 120 at the ends of the relevant string 111, 112, 113. In this design, the filament 100 may comprise a conversion layer 160 subdivided into three layer sections assigned to the strings 111, 112, 113. Two contact structures may be accessible at the opposite ends of the filament 100. In each case, two contact structures may be accessible between the strings 111, 112, 113 and in intermediate regions between the layer sections of the conversion layer 160. In a departure from this example, configurations based on the other designs from among those explained above may also be provided, for example, comprising a continuous conversion layer 160 and comprising contact structures projecting laterally from the conversion layer 160, or comprising contact structures extending to ends of the filament 100 (not illustrated in each case).

On the basis of the approaches demonstrated above, filaments 100 comprising an even greater number of strings of semiconductor chips 120 may furthermore be realized. The strings may electrically connect in series or electrically isolated. By way of example, configurations in which a filament 100 comprises a plurality of series-connected strings and at least one string electrically isolated therefrom are furthermore possible (each not illustrated).

Further possible modifications consist of using other designs of radiation-emitting semiconductor chips or light emitting diode chips 120. For exemplary illustration, FIGS. 14 and 15 show a lateral sectional illustration and a plan view illustration of a further filament 100 comprising a construction comparable to FIGS. 3 and 4. The filament 100 comprises two strings 111, 112 of semiconductor chips 120 electrically connected in series and three contact structures 131, 132, 133 to electrically contact and drive the strings 111, 112 that electrically connect to semiconductor chips 120 at the ends of the strings 111, 112. The strings 111, 112 comprise different numbers of semiconductor chips 120. Furthermore, the strings 111, 112 themselves electrically connect in series to constitute a series circuit. The radiation-emitting semiconductor chips 120 do not comprise front-side contacts, but rather rear-side contacts 122. In this configuration, the semiconductor chips 120 may be so-called flip-chips.

A further constituent of the filament 100 shown in FIGS. 14 and 15 is a carrier 150 comprising further contact structures 137 in addition to the contact structures 131, 132, 133 provided to contact the strings 111, 112. Via the contact structures 137, the semiconductor chips 120 in the strings 111, 112 electrically connect in series among one another. The contact structures 137, like the contact structures 131, 132, 133, are configured from an electrically conductive or metallic material. Moreover, the contact structures 131, 132, 133, 137 arranged on the carrier 150 may be realized in the form of contact pads.

The semiconductor chips 120, via their rear-side contacts 122, electrically and mechanically connect to corresponding contact structures 131, 132, 133, 137. At these locations, a connection may be produced via an electrically conductive connection medium, for example, a solder or an electrically conductive adhesive (not illustrated).

The filament 100 shown in FIGS. 14 and 15 furthermore comprises a conversion layer 160 subdivided into two layer sections assigned to the strings 111, 112. In this case, the carrier 150 in the region of the semiconductor chips 120 and the semiconductor chips 120 arranged on the carrier 150 are enclosed by the conversion layer 160.

The two contact structures 131, 132 electrically connect to semiconductor chips 120 at the ends of the series circuit comprising the two strings 111, 112. In this way, the contact structures 131, 132 may be used as primary contact structures with the aid of which the two strings 111, 112 may be jointly supplied with electrical energy. The two contact structures 131, 132 are located at the ends of the filament 100 and at these locations together with the carrier 150 project from the conversion layer 160 such that the contact structures 131, 132 are accessible for contacting. The further contact structure 133 electrically connects to semiconductor chips 120 of the opposite ends of the two strings 111, 112 such that the strings 111, 112 electrically connect in series via the contact structure 133 is accessible between the strings 111, 112 in an intermediate region between the two layer sections of the conversion layer 160. The contact structure 133 may be used as an intermediate tap to optionally electrically drive only one of the strings 111, 112.

For the filament 100 shown in FIGS. 14 and 15 and comprising the semiconductor chips 120 comprising rear-side contacts 122 and the carrier 150 additionally equipped with contact structures 137, via which the semiconductor chips 120 in the strings 111, 112 electrically connect among one another, alternative configurations derived from the designs demonstrated above may be considered in the same way.

A configuration corresponding to the construction shown in FIGS. 5 and 6 is possible, for example. In this sense, FIGS. 16 and 17 show a lateral sectional illustration and a plan view illustration of a further filament 100 comprising two strings 111, 112 of semiconductor chips 120 comprising rear-side contacts 122, the strings electrically connected in series, and a carrier 150 comprising contact structures 131, 132, 133, 137. The filament 100 furthermore comprises a conversion layer 160 enclosing the carrier 150 in the region of the semiconductor chips 120 and the semiconductor chips 120, the conversion layer comprising a continuous shape. A contact structure 133 electrically connects to semiconductor chips 120 of the opposite ends of the two strings 111, 112 and may be used as an intermediate tap projects laterally from the conversion layer 160. If appropriate, the carrier 150 may comprise a partial section that projects laterally from the conversion layer 160 and on which the contact structure 133 is arranged (not illustrated).

For a filament 100 comprising semiconductor chips 120 comprising rear-side contacts 122, a configuration is furthermore possible in which a contact structure 133 corresponding to the construction shown in FIGS. 7 to 9 extends to an end of the filament 100\ such that all contact structures 131, 132, 133 are accessible at the opposite ends of the filament 100. A further modification considered is a filament 100 comprising electrically isolated strings 111, 112 that may be realized with a construction comparable to FIGS. 10 and 11. In this case, use may be made of a carrier 150 comprising contact structures 137 and comprising four contact structures 131, 132, 133, 134 for contacting the strings 111, 112. Via the contact structures 137, the semiconductor chips 120 in the strings 111, 112 may electrically connect among one another. Of the four contact structures 131, 132, 133, 134, two in each case may electrically connect to semiconductor chips 120 of the ends of a string 111, 112. Furthermore, in accordance with the designs explained above, variations comprising a greater number of strings of semiconductor chips 120 may be considered (each not illustrated).

FIGS. 18 and 19 show, in a lateral sectional illustration and in a plan view illustration, a further design that may be considered for a filament 100 comprising radiation-emitting semiconductor chips 120 comprising rear-side contacts 122. The filament 100 comprises two strings 111, 112 of semiconductor chips 120 electrically connected in series and three contact structures 131, 132, 133 for electrically contacting and driving the strings 111, 112 electrically connected to semiconductor chips 120 at the ends of the strings 111, 112. The contact structures 131, 132, 133 may be realized with a planar shape. The strings 111, 112 comprise different numbers of semiconductor chips 120, and themselves electrically connect in series to constitute a series circuit. A further constituent is a conversion layer 160 enclosing the semiconductor chips 120, the conversion layer being subdivided into two layer sections assigned to the strings 111, 112.

As shown in FIG. 18, the semiconductor chips 120 in the strings 111, 112 are arranged alternately side-inverted with respect to one another with regard to the front and rear sides and electrically and mechanically connect to one another via their contacts 122. At these locations a connection may be produced via an electrically conductive connection medium, for example, a solder or an electrically conductive adhesive. The semiconductor chips 120 located at the ends of the strings 111, 112 may also connect to the contact structures 131, 132, 133 in this way (not illustrated).

The two contact structures 131, 132 electrically connect to semiconductor chips 120 at the ends of the series circuit comprising the two strings 111, 112. As a result, the contact structures 131, 132 may be used as primary contact structures with the aid of which the two strings 111, 112 may be electrically driven jointly. The contact structures 131, 132 are located at the ends of the filament 100 and project from the layer sections of the conversion layer 160 at these locations such that the contact structures 131, 132 are accessible for contacting. The further contact structure 133 configured with an elongate shape and electrically connected to semiconductor chips 120 of the opposite ends of the two strings 111, 112 such that the strings 111, 112 electrically connect in series, is accessible between the strings 111, 112 in an intermediate region between the layer sections of the conversion layer 160. The contact structure 133 may serve as an intermediate tap to optionally electrically operate only one of the strings 111, 112.

FIG. 18 furthermore illustrates the possible use of an electrically conductive or metallic compensation element 139 in the string 112 to connect a semiconductor chip 120 connected to the contact structure 133 to a further semiconductor chip 120 of the same string 112. In this way, an increased distance present at this location on account of the contact structure 133 may be compensated for. The relevant semiconductor chips 120 or their rear-side contacts 122 may connect to the compensation element 139 via an electrically conductive connection medium (not illustrated).

For the filament 100 shown in FIGS. 18 and 19 and comprising the semiconductor chips 120 arranged side-inverted with respect to one another, modified configurations derived from the designs demonstrated above may be considered in the same way.

By way of example, a construction comparable to FIGS. 5 and 6 is possible. In this sense, FIGS. 20 and 21 thus show a lateral sectional illustration and a plan view illustration of a further filament 100 comprising two strings 111, 112 (electrically connected in series) of semiconductor chips 120 comprising rear-side contacts 122 arranged side-inverted with respect to one another and connect to one another via the contacts 122. A further constituent is a conversion layer 160 enclosing the semiconductor chips 120 and comprising a continuous shape. A contact structure 133 electrically connects to adjacent semiconductor chips 120 of the ends of the two strings 111, 112 and located between the rear-side contacts 122 thereof, and may be used as an intermediate tap, projects laterally from the conversion layer 160. The contact structure 133 may comprise an elongate shape comprising a small width. An electrically conductive compensation element 139 is furthermore provided in the string 112, via which compensation element the semiconductor chip 120 connected to the contact structure 133 connects to a further semiconductor chip 120 of the same string 112.

Further configurations may furthermore be considered for a filament 100 comprising semiconductor chips 120 arranged side-inverted with respect to one another. It is possible, for example, to constitute a contact structure 133 in a similar manner to the construction shown in FIGS. 7 to 9 with a shape extending to an end of the filament 100, such that all of the contact structures 131, 132, 133 are accessible at the opposite ends of the filament 100. A further possible design is a filament 100 comprising electrically isolated strings 111, 112 and four contact structures 131, 132, 133, 134, of which two in each case electrically connect to semiconductor chips 120 at the ends of a string 111, 112. In this case, contact structures 133, 134 electrically connect to semiconductor chips 120 of adjacent ends of the different strings 111, 112 and serve as a split tap may be embodied, for example, in a manner mechanically connected to one another and electrically insulated from one another, for example, using an insulating connection element that connects the contact structures 133, 134. It is also possible for the strings 111, 112 to be mechanically held together via a conversion layer 160. Furthermore, in accordance with the configurations explained above, variants comprising a greater number of strings of semiconductor chips 120 may be considered (each not illustrated).

Further possible modifications consist of using other designs of a carrier. In this sense, FIGS. 22 to 24 show a lateral sectional illustration and two plan view illustrations of a further filament 100 comprising two strings 111, 112 of semiconductor chips 120 electrically connected in series and three contact structures 131, 132, 133 to electrically contact and drive the strings 111, 112 electrically connected to semiconductor chips 120 at the ends of the strings 111, 112. The strings 111, 112 comprise different numbers of semiconductor chips 120. Furthermore, the strings 111, 112 themselves electrically connect in series to constitute a series circuit. A further constituent is a conversion layer 160 subdivided into two layer sections assigned to the strings 111, 112. The plan view illustration in FIG. 23 shows the filament 100 without the conversion layer 160.

As shown in FIGS. 22 and 23, the filament 100 comprises a carrier 151 that laterally surrounds the semiconductor chips 120. The carrier 151 and the semiconductor chips 120 comprise corresponding thicknesses. Moreover, the contact structure 133 configured with an elongate shape is laterally surrounded by the carrier 151, and for this purpose is configured with a thickness corresponding to the semiconductor chips 120 and the carrier 151. The other two contact structures 131, 132, located at the opposite ends of the filament 100, are arranged on the carrier 151 and configured in the form of contact pads.

The carrier 151 may be configured from a reflective material, for example. This may be a plastics material (for example, silicone or epoxy) comprising reflective particles (for example, $TiO_2$) embedded therein. In the context of production, the semiconductor chips 120 and the contact structure 133 may be encapsulated with material of the carrier 151, for example, by carrying out a molding process or potting material of the carrier 151.

FIGS. 22 and 23 indicate a design of the semiconductor chips 120 comprising front-side contacts (not illustrated) to which bond wires 170 connect. Via the bond wires 170, electrical connections are produced between the semiconductor chips 120 in the strings 111, 112 among one another and between semiconductor chips 120 at the ends of the strings 111, 112 and the associated contact structures 131, 132, 133.

The carrier 151 is enclosed with the layer sections of the conversion layer 160 in the region of the semiconductor chips 120. The contact structures 131, 132, 133 are only partly covered with the conversion layer 160 and, in the contact structures 131, 132, together with the carrier 150 at the ends of the filament 100 project from the conversion layer 160 such that the contact structures 131, 132, 133 are accessible for contacting.

The two contact structures 131, 132 electrically connect to semiconductor chips 120 at the ends of the series circuit comprising the two strings 111, 112, and may be used as primary contact structures to jointly electrically drive the two strings 111, 112. The further contact structure 133 electrically connects to semiconductor chips 120 of the opposite ends of the two strings 111, 112 such that the strings 111, 112 electrically connect in series, and which is accessible between the separate layer sections of the conversion layer 160, may be used as an intermediate tap to optionally electrically drive only one of the strings 111, 112.

Alternative configurations are possible for the filament 100 shown in FIGS. 22 to 24 and comprising the encapsulated carrier 151. It is possible, for example, for the contact structures 131, 132 at the end sides also to be laterally surrounded by the carrier 151 and, for this purpose, for the contact structures 131, 132 to be configured with a thickness corresponding to the semiconductor chips 120 and the carrier 151. In a corresponding manner, the contact structure 133 may be arranged on the carrier 151 and configured in the form of a contact pad. Furthermore, alternative configurations derived from the designs demonstrated above may be considered.

A construction comparable to FIGS. 5 and 6 is possible, for example. In this sense, FIGS. 25 to 27 show a lateral sectional illustration and plan view illustrations of a further filament 100 comprising two strings 111, 112 of semiconductor chips 120, the strings electrically connecting in series, three contact structures 131, 132, 133 and a carrier 151 laterally surrounding the semiconductor chips 120. The two contact structures 131, 132 are arranged on the carrier 151, whereas the contact structure 133 is laterally surrounded in part by the carrier 151. A further constituent is a conversion layer 160 enclosing the carrier 151 and comprising a continuous shape, which is omitted in the plan view illustration in FIG. 26. The contact structure 133 projects laterally from the conversion layer 160.

For a filament 100 comprising a carrier 151 laterally surrounding semiconductor chips 120, a configuration comparable to FIGS. 7 to 9 and comprising a contact structure 133 extending to an end of the filament 100 is furthermore possible. In this case, the contact structure 133 may be arranged on the carrier 151, for example. Furthermore, a design comparable to FIGS. 10 and 11 may be provided, that is to say comprising electrically isolated strings 111, 112 and four contact structures 131, 132, 133, 134, each two of which electrically connect to semiconductor chips 120 at the ends of a string 111, 112. In this case, contact structures 133, 134 electrically connected to semiconductor chips 120 of adjacent ends of the different strings 111, 112 and serve as a split tap may be laterally surrounded by the carrier 151. Furthermore, in accordance with the configurations explained above, variants comprising a greater number of strings of semiconductor chips 120 may be considered (each not illustrated).

As indicated above, the configurations and variants of a light emitting filament 100 as explained with reference to FIGS. 1 to 27 may be used in a retrofit lamp 200. For elucidation, FIG. 28 illustrates such a retrofit lamp 200 comprising a filament 100 indicated by dashed lines. The retrofit lamp 200 comprises a bulb 201, within which the filament 100 is arranged. Furthermore, the retrofit lamp 200 comprises a lamp base 202 comprising a screw thread. For electrical contacting and thus connection to an electrical mains, the retrofit lamp 200 comprising the lamp base 202 may be screwed into a suitable lampholder (not illustrated).

The retrofit lamp 200 furthermore comprises a driver circuit connected to the filament 100 and with the aid of which a mains voltage may be converted into a forward voltage suitable for operation of the strings of the filament 100. In this context, the above-described configurations of the filament 100 enable high flexibility with regard to an electrical interconnection. In this case, the interconnection may be controlled to the greatest possible extent independently of a predefined lumen packet to achieve an efficient mode of operation. Details concerning possible interconnections are explained more specifically with reference to the following figures.

Figure 29:
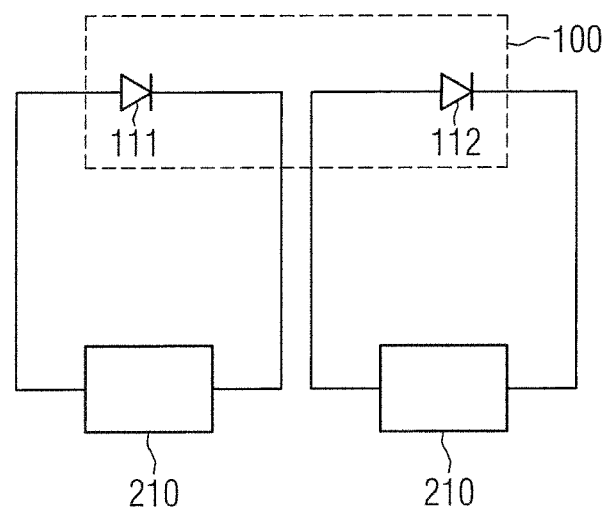
FIG. 29 shows an interconnection of strings of a filament with separate driver units.

The strings of the filament 100 may be interconnected, for example, in separate circuits. Such a configuration may be employed, for example, in a filament 100 comprising electrically isolated strings. For elucidation, FIG. 29 illustrates one possible interconnection of such a filament 100, wherein the filament 100 illustrated by way of example comprises two electrically isolated strings 111, 112 of semiconductor chips. The filament 100 may comprise, for example, a construction corresponding to FIGS. 10 and 11. As illustrated in FIG. 29, the strings 111, 112 electrically connect to separate driver units 210. With the aid of the driver units 210, the strings 111, 112 may be electrically driven, that is to say have a forward voltage applied to them, separately from one another. For this purpose, the driver units 210 connect to the contact structures provided for contacting the strings 111, 112. The driver units 210 may be part of a common driver circuit arranged in the retrofit lamp 200 and connected to a voltage source (electrical mains) during operation of the retrofit lamp 200 (not illustrated).

Figure 30:
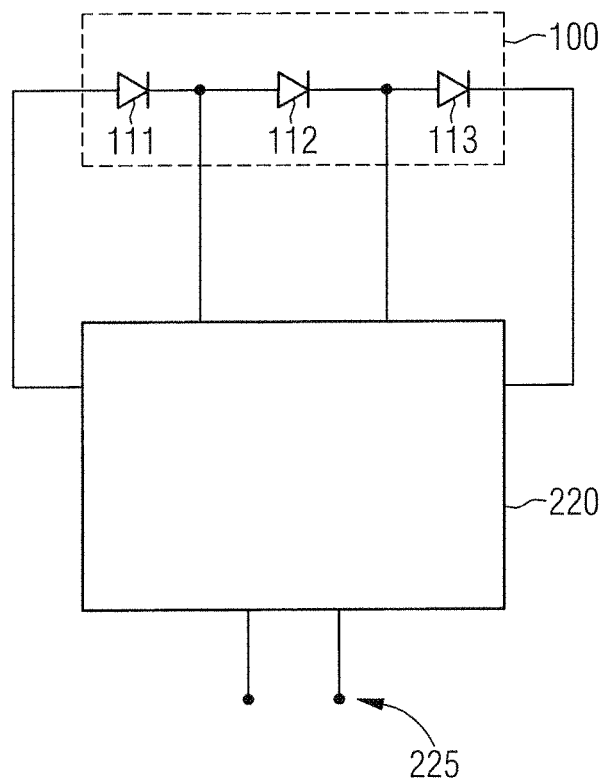
FIG. 30 shows an interconnection of strings of a filament with a multistage driver.

In one configuration of the filament 100 comprising strings electrically connected in series, a multistage driver 220 may be used to drive the filament 100 as shown in FIG. 30. The filament 100 illustrated by way of example here comprises three series-connected strings 111, 112, 113 of semiconductor chips. The filament 100 may comprise, for example, a construction corresponding to FIGS. 12 and 13. The driver 220 arranged in the retrofit lamp 200 connects to the contact structures provided for contacting the strings 111, 112, 113 and connects to a voltage source 225 (electrical mains) during operation of the retrofit lamp 200. The voltage source 225 may provide, for example, an AC voltage comprising a root-mean-square value of 230V. Individual, a plurality or else all of the strings 111, 112, 113 of the filament 100 may be electrically driven with the aid of the driver 220. In this case, the driver 220 may provide a forward voltage applied to the filament 100 and adjusted as closely as possible to the mains voltage.

Figure 31:
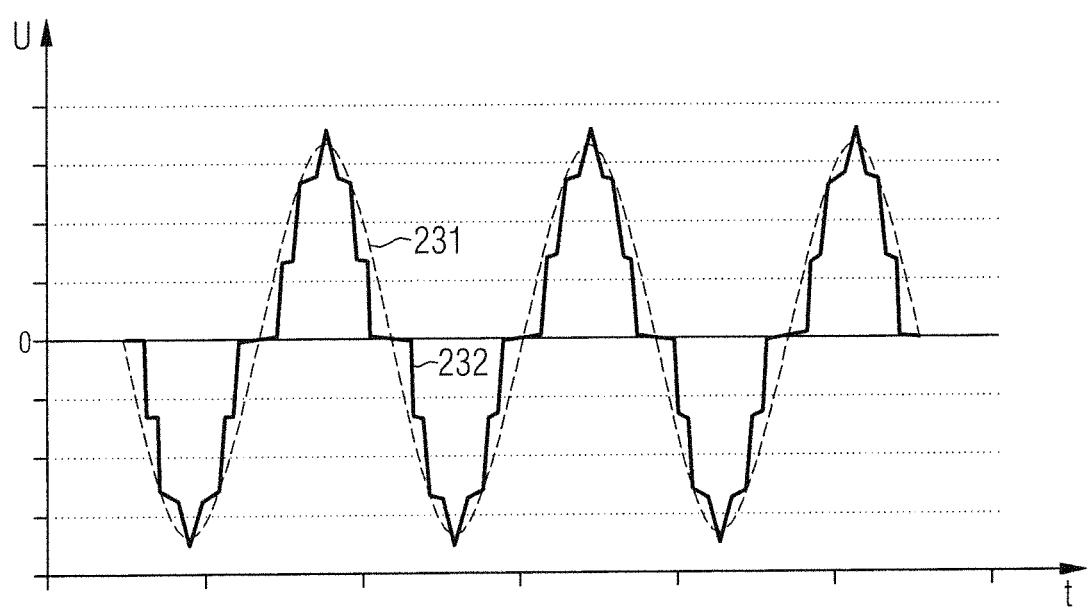
FIG. 31 shows a diagram with voltage profiles.

To elucidate this aspect, FIG. 31 shows a diagram with profiles 231, 232 of a voltage U as a function of time t. The sinusoidal voltage profile 231 relates to the mains voltage. The stepped voltage profile 232 relates to a forward voltage provided by different driving of strings 111, 112, 113 (comprising different numbers of semiconductor chips. In this case, the strings 111, 112, 113 are turned on and off at different points in time with the aid of the driver 220.

In the region of the zero crossings of the mains voltage, none of the strings 111, 112, 113 and hence no semiconductor chip of the filament 100 is driven and supplied with electrical energy. In each case, increasingly more semiconductor chips of the filament 100 are electrically operated with increasing absolute value of the mains voltage 231. In the region of the maximum absolute value of the mains voltage 231, all of the strings 111, 112, 113 and thus all of the semiconductor chips of the filament 100 are operated. In a corresponding manner, increasingly fewer semiconductor chips of the filament 100 are each operated with decreasing absolute value of the mains voltage 231. It becomes clear that the stepped voltage profile 232 of the forward voltage in this mode of operation is closely adapted to the voltage profile 231 of the mains voltage. For reasons of clarity, a voltage rectification such as carried out in the driver 220 for the operation of the filament 100, and which results in only positive half-cycles being present, is omitted with regard to the voltage profile 232.

Figure 32:
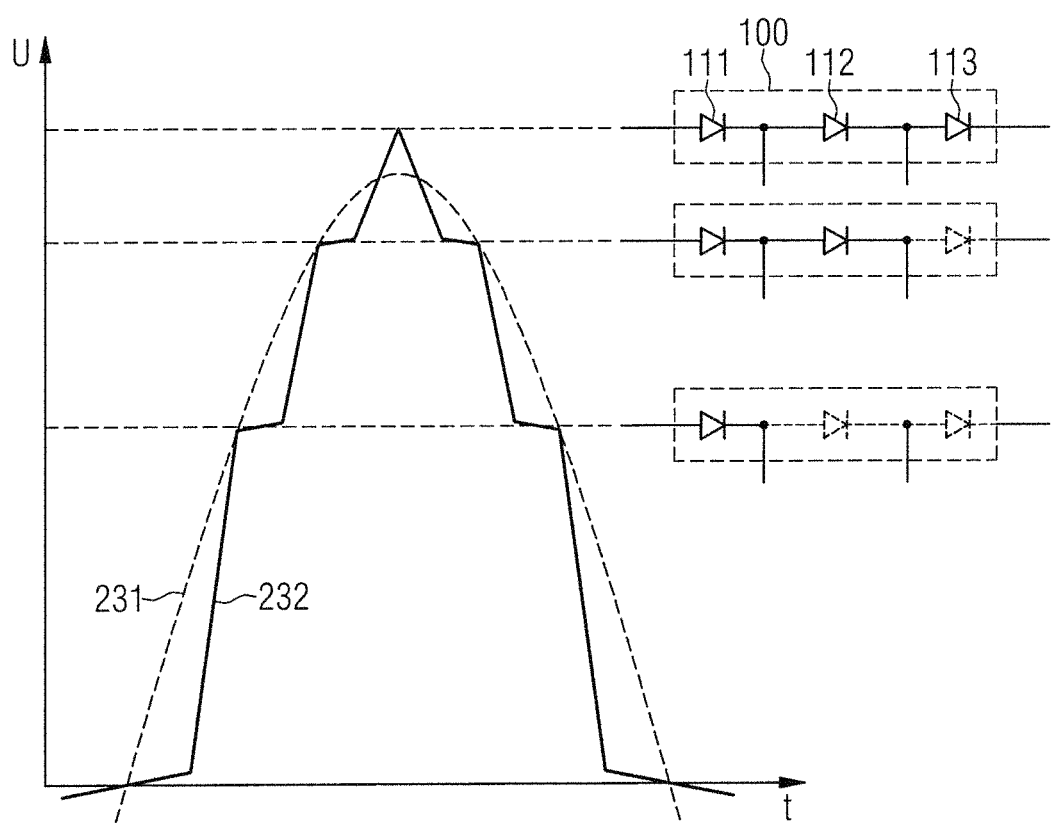
FIG. 32 shows an enlarged excerpt from the diagram from FIG. 31 with an additional illustration of a driving of strings of a filament.

FIG. 32 shows an enlarged excerpt from the diagram from FIG. 31, wherein to elucidate the abovementioned mode of operation, a possible driving of the strings 111, 112, 113 of the filament 100 is additionally illustrated. In the region of the zero crossings of the mains voltage 231, none of the strings 111, 112, 113 is operated. With increasing absolute value of the mains voltage 231, first only the string 111 is switched on and thereby supplied with electrical energy. As the absolute value of the mains voltage 231 increases further, first the string 112 and then the string 113 are turned on such that all of the strings 111, 112, 113 are operated in the region of the peak value of the mains voltage 231. In a manner corresponding thereto, with decreasing absolute value of the mains voltage 231, first, the string 113, then the string 112 and finally the string 111 are turned off such that once again none of the filaments 111, 112, 113 is operated in the region of the then following zero crossing of the mains voltage 231. Afterward or with a renewed increase in the voltage absolute value of the mains voltage 231, this procedure is repeated.

Driving the strings 111, 112, 113 of the filament 100 as explained with reference to FIG. 32 should be regarded merely as an exemplary configuration and, that, in a departure therefrom, other configurations may be provided with regard to driving the filament 100 with the aid of the driver 220. It is possible, for example, with increasing absolute value of the mains voltage 231, to operate first, only the string 111, then the two strings 112, 113, subsequently the two strings 111, 112, and then all three strings 111, 112, 113. With decreasing absolute value of the mains voltage 231, an energization of the filament 100 corresponding thereto may be carried out.

In a configuration of the filament 100 comprising a different number of strings, other configurations with regard to electrical driving of the strings of the filament 100 may be considered in the corresponding manner.

In an interconnection of strings of a filament 100 in separate circuits such as was explained with reference to FIG. 29, a forward voltage may be adjusted to a mains voltage by suitable driving of the strings with the aid of a driver in a corresponding manner. In this case, too, it is possible to electrically drive individual, or a plurality or all of the strings together, although separately from one another.

With regard to the configuration shown in FIG. 29, the common driver comprising the driver units 210 may be configured, for example, such that the following driving of the strings 111, 112 (comprising different numbers of semiconductor chips) is carried out. In the region of the zero crossings of the mains voltage, none of the strings 111, 112 is electrically operated. With increasing absolute value of the mains voltage 231, it is possible to electrically operate in each case first only the string 112, then only the string 111, and subsequently both strings 111, 112 together, but separately from one another. With decreasing absolute value of the mains voltage, an energization of the strings 111, 112 corresponding thereto may each be carried out.

A retrofit lamp 200 may be configured not just with a single filament 100, but with a plurality of filaments 100, which if appropriate are structurally identical. In this context, too, the above-described configurations of a filament 100 enable high flexibility with regard to an electrical interconnection and mode of operation. In this case, in a corresponding manner it is possible to employ separate drivers or driver units or else one or a plurality of multistage drivers to drive the filaments 100. The plurality of filaments 100 may be interconnected in series and/or in parallel (not illustrated).

Although our filaments and lighting devices have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2016 109 665.2, the subject matter of which is incorporated herein by reference.

The invention claimed is:

1. A filament comprising:
a plurality of strings comprising radiation-emitting semiconductor chips electrically connected in series; and
a plurality of contact structures to contact the strings, wherein the contact structures electrically connect to semiconductor chips at ends of the strings such that the strings are electrically drivable via the contact structures, wherein
the filament is configured such that the strings are electrically drivable at least separately from one another via the contact structures,
the strings comprise different numbers of semiconductor chips, and
all of the semiconductor chips of the filament are arranged along a common line.

2. The filament according to claim 1,
wherein a plurality of strings electrically connect in series to constitute a series circuit,
two contact structures electrically connect to semiconductor chips at the ends of the series circuit, and
at least one further contact structure is present, via which two strings of the series circuit electrically connect in series.

3. The filament according to claim 1,
wherein a plurality of strings are electrically isolated, and
in the isolated strings, each of two contact structures electrically connect to semiconductor chips at the ends of the strings.

4. The filament according to claim 1, wherein at least two contact structures are accessible at the ends of the filament.

5. The filament according to claim 1, wherein at least one contact structure is accessible in a region between the ends of the filament.

6. The filament according to claim 1, wherein two contact structures electrically connected to semiconductor chips at the ends of a string are accessible at one end of the filament.

7. The filament according to claim 1, wherein the semiconductor chips of the strings are covered with a conversion layer for radiation conversion.

8. The filament according to claim 7, wherein at least two contact structures at the ends of the filament project from the conversion layer.

9. The filament according to claim 7, wherein at least two contact structures at the ends of the filament project from the conversion layer, and
at least one further contact structure projects laterally from the conversion layer in a region between the ends of the filament.

10. The filament according to claim 7,
wherein the semiconductor chips of the strings are each covered with a separate layer section of the conversion layer, and
at least one contact structure is accessible in an intermediate region of two adjacent layer sections of the conversion layer.

11. The filament according to claim 1, further comprising at least one of:
a carrier on which the semiconductor chips and the contact structures are arranged; and
a carrier laterally surrounding the semiconductor chips.

12. The filament according to claim 1, wherein the semiconductor chips of the strings are arranged alternately side-inverted with respect to one another.

13. A lighting device, comprising the filament according to claim 1.

14. The lighting device according to claim 13, further comprising a multistage driver that drives the strings of the filament.

15. The lighting device according to claim 13, wherein the strings of the filament are interconnected in separate circuits.

16. The lighting device according to claim 15, further comprising a driver connected to the filament to convert a mains voltage into a forward voltage, wherein the driver is configured to drive the strings of the filament such that the forward voltage is adjusted to the mains voltage.

17. A filament comprising:
a plurality of strings comprising radiation-emitting semiconductor chips electrically connected in series; and a plurality of contact structures to contact the strings, wherein the contact structures electrically connect to semiconductor chips at ends of the strings such that the strings are electrically drivable via the contact structures, wherein the filament is configured such that the strings are electrically drivable at least separately from one another via the contact structures, and the filament comprises at least one of:

the semiconductor chips of the strings are each covered with a separate layer section of a conversion layer for radiation conversion, and at least one contact structure is accessible in an intermediate region of two adjacent layer sections of the conversion layer; and the semiconductor chips of the strings are arranged alternately side-inverted with respect to one another.

18. A lighting device comprising a filament and a driver connected to the filament, wherein the filament comprises a plurality of strings comprising radiation-emitting semiconductor chips electrically connected in series and a plurality of contact structures to contact the strings, the contact structures electrically connect to semiconductor chips at ends of the strings such that the strings are electrically drivable via the contact structures, the filament is configured such that the strings are electrically drivable at least separately from one another via the contact structures, the strings comprise different numbers of semiconductor chips, all of the semiconductor chips of the filament are arranged along a common line, the driver is configured to convert a mains voltage into a forward voltage, the forward voltage is provided to operate the filament and applied to the filament, and the driver is configured to drive the strings of the filament such that the forward voltage comprises a stepped voltage profile adjusted to the mains voltage.

19. The lighting device according to claim 18, wherein the driver is configured to optionally drive individual, a plurality or all of the strings of the filament such that, with increasing magnitude of the mains voltage, increasingly more semiconductor chips of the filament are each electrically operated, in a region of a maximum magnitude of the mains voltage, each of the strings and thus all of the semiconductor chips of the filament are electrically operated, with decreasing magnitude of the mains voltage, increasingly fewer semiconductor chips of the filament are each electrically operated, and in a region of zero crossings of the mains voltage, all of the strings and thus all of the semiconductor chips of the filament are not operated.

* * * * *